United States Patent
Yonekuta et al.

(10) Patent No.: US 10,840,461 B2
(45) Date of Patent: Nov. 17, 2020

(54) ORGANIC ELECTROLUMINESCENT ELEMENT MATERIAL, ORGANIC ELECTROLUMINESCENT ELEMENT AND PRODUCTION METHOD FOR ORGANIC ELECTROLUMINESCENT ELEMENT

(75) Inventors: Yasunori Yonekuta, Kanagawa (JP); Koji Takaku, Kanagawa (JP); Naoyuki Hayashi, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 1107 days.

(21) Appl. No.: 13/805,154

(22) PCT Filed: Jun. 28, 2011

(86) PCT No.: PCT/JP2011/064833
§ 371 (c)(1),
(2), (4) Date: Jul. 1, 2013

(87) PCT Pub. No.: WO2012/002399
PCT Pub. Date: Jan. 5, 2012

(65) Prior Publication Data
US 2013/0270529 A1    Oct. 17, 2013

(30) Foreign Application Priority Data
Jun. 30, 2010   (JP) ................................. 2010-150594

(51) Int. Cl.
| | |
|---|---|
| H01L 51/50 | (2006.01) |
| H01L 51/46 | (2006.01) |
| H01L 51/00 | (2006.01) |
| C08G 77/388 | (2006.01) |
| C08K 5/18 | (2006.01) |
| C08G 77/12 | (2006.01) |

(52) U.S. Cl.
CPC ........ H01L 51/0094 (2013.01); C08G 77/388 (2013.01); C08K 5/18 (2013.01);
(Continued)

(58) Field of Classification Search
CPC ............ H01L 51/0094; H01L 51/0059; H01L 51/006; H01L 51/56; H01L 51/5056;
(Continued)

(56) References Cited

U.S. PATENT DOCUMENTS 5,061,569 A * 10/1991 VanSlyke ............... C09K 11/06
                                                       252/301.16
5,414,069 A * 5/1995 Cumming .......... C08G 73/0233
                                                       528/10
(Continued)

FOREIGN PATENT DOCUMENTS

JP   2006-131780 A   5/2006
JP   2007-169593 A   7/2007
(Continued)

OTHER PUBLICATIONS

Moon et al., "Synthesis, photoconductivity, and photogeneration efficiency of polysiloxanes bearing hole-conductors for photorefractive materials", 2008, Journal of Photochemistry and Photobiology A: Chemistry, vol. 194, pp. 327-332.*

(Continued)

Primary Examiner — Dylan C Kershner
(74) Attorney, Agent, or Firm — Riverside Law LLP

(57) ABSTRACT

Provided is an organic electroluminescence device material, which, in its production, is free from formation of impurities that worsen the performance of organic EL devices, which, in forming an upper layer by coating, does not cause dissolution mixing or swelling mixing, which forms a film of good quality and which contributes toward improving the performance (high durability, and low driving voltage) of organic EL devices. The organic electroluminescence device material is a siloxane compound having a recurring unit represented by the following general formula (1):

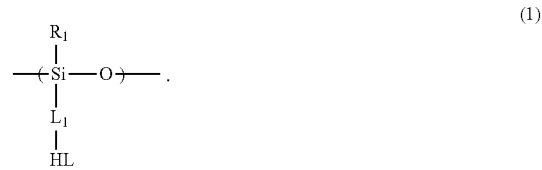

13 Claims, 1 Drawing Sheet

(52) U.S. Cl.
CPC ............ *H01L 51/006* (2013.01); *C08G 77/12* (2013.01); *H01L 51/0043* (2013.01); *H01L 51/0059* (2013.01); *H01L 51/5056* (2013.01); *H01L 51/5088* (2013.01)

(58) Field of Classification Search
CPC ... H01L 51/5088; C08G 77/388; C08G 77/12; C08L 83/04; C09K 11/06; C09K 2211/10; C09K 2211/1003; C09K 2211/1007; C09K 2211/1011; C09K 2211/1014; C09K 2211/14; C09K 2211/1408; C09K 2211/1416; C09K 2211/1425; C09K 2211/1433; C08K 5/18
USPC ................... 428/690, 691, 917; 427/58, 66; 313/500–512; 257/40, 88–104, 257/E51.001–E51.052; 252/301.16–301.35
See application file for complete search history.

(56) References Cited

U.S. PATENT DOCUMENTS

| | | | |
|---|---|---|---|
| 5,840,816 A * | 11/1998 | Kobayashi | C08L 83/04 526/115 |
| 6,544,670 B1 * | 4/2003 | Kitano | C08G 77/26 313/504 |
| 7,880,164 B2 | 2/2011 | Lee et al. | |
| 2003/0129451 A1 * | 7/2003 | Nukada | H01L 51/0035 428/690 |
| 2006/0202166 A1 * | 9/2006 | Suzuki | C08G 77/388 252/301.16 |
| 2007/0138483 A1 | 6/2007 | Lee et al. | |
| 2008/0007158 A1 * | 1/2008 | Farooq | C08G 77/388 313/504 |
| 2008/0303421 A1 * | 12/2008 | Xu | H01L 51/0059 313/504 |
| 2010/0060150 A1 * | 3/2010 | Igarashi | C07F 7/21 313/504 |

FOREIGN PATENT DOCUMENTS

| | | |
|---|---|---|
| JP | 2008-502770 A | 1/2008 |
| WO | 2008/053935 A1 | 5/2008 |

OTHER PUBLICATIONS

International Search Report for International Application No. PCT/JP2011/064833, dated Sep. 6, 2011.

* cited by examiner

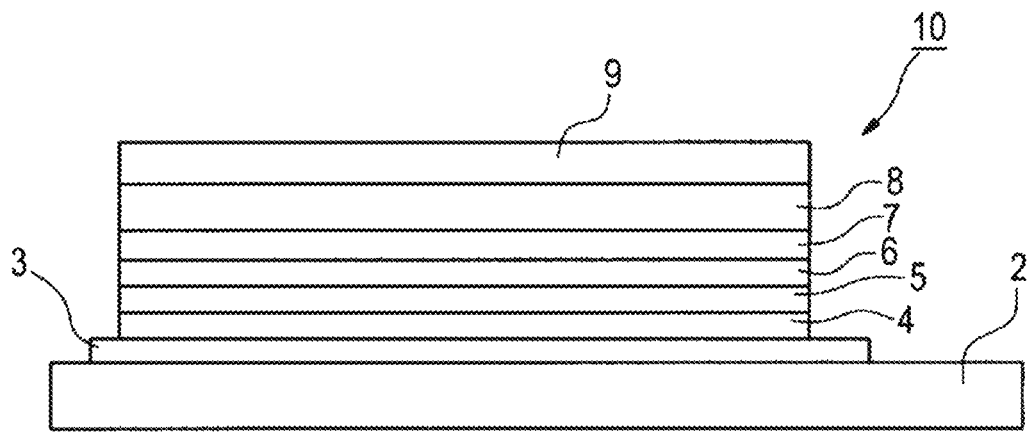

ORGANIC ELECTROLUMINESCENT ELEMENT MATERIAL, ORGANIC ELECTROLUMINESCENT ELEMENT AND PRODUCTION METHOD FOR ORGANIC ELECTROLUMINESCENT ELEMENT

CROSS REFERENCE TO RELATED APPLICATIONS

This application is a U.S. National Stage of International Application No. PCT/JP2011/064833, filed Jun. 28, 2011, which claims the benefit of priority to Japanese Patent Application No. 2010-150594, filed Jun. 30, 2010, all of which are hereby incorporated by reference in their entirety.

TECHNICAL FIELD

The present invention relates to an organic electroluminescence device material, an organic electroluminescence device, a method for producing an organic electroluminescence device, and a film containing the organic electroluminescence device material.

BACKGROUND ART

As devices utilizing an organic material, studies of organic electroluminescence devices (hereinafter also referred to as OLED, organic EL devices), transistors using an organic semiconductor and others are being made actively. In particular, organic electroluminescence devices are expected to be developed for lighting purposes as solid-state light emission-type large-area full-color display devices and inexpensive large-area planar light sources. In general, an organic electroluminescence device comprises an organic layer including a light emitting layer and a pair of counter electrodes to sandwich the organic layer therebetween. When a voltage is applied to the organic electroluminescence device of the type, then electrons are injected into the organic layer from the cathode therein while holes are thereinto from the anode. The electron and the hole recombine in the light emitting layer, and the energy level returns from the conduction band to the valence band whereupon energy is emitted as light for light emission.

The organic EL device can be produced through film formation of the organic layer therein, for example, according to a dry method of vapor deposition or the like or a wet method of coating or the like; however, from the viewpoint of productivity, a wet method is specifically noted.

A low-molecular arylamine such as typically bis[N-(1-naphthyl)-N-phenyl]benzidine (NPD) or triphenyldiamine (TPD) is a material having a high hole mobility and chemically stable, and is often used as the hole injection and hole transport layer in a vapor deposition-type OLED.

However, the low-molecular arylamine has a high solubility in solvent, and therefore has a problem in that, in a coating-type OLED, the lower layer of such a low-molecular arylamine dissolves during lamination of the upper layer (for example, light emitting layer) thereon to cause layer mixing to thereby worsen the performance of the organic EL device.

Even though the upper layer could be laminated without dissolution of the lower layer, the low-molecular arylamine crystallizes whereby the formed film would be cracked, or that is, the film formability is poor.

For preventing the dissolution of the lower layer, there is employed a method of using a polymer material as the lower layer, or a method of crosslinking and hardening the lower layer formed by coating. However, an ordinary polymer material such as acrylate, methacrylate or the like worsens the device performance owing to the influence of the polymerization initiator that may remain in minute amounts in the polymer during production. Even a polymer material not using a polymerization initiator, such as polyether or the like, may swell and may mix in the upper layer material.

On the other hand, the method of crosslinking and hardening the film after formed by coating is also problematic in point of the negative influence on device of the polymerization initiator used, for which, therefore, there has been investigated a thermal polymerization method with a styryl compound or the like; however, the method still involves a problem in that a high temperature and a long time are required for hardening the film.

Against the problem with the polymerization initiator mentioned above, there is known a siloxane polymer as a polymer compound not requiring a polymerization initiator in producing it through polymerization.

Using such a siloxane polymer as an organic electroluminescence device material is known, and for example, PTL 1 describes a siloxane polymer having at least two arylamine units in which the unit directly bonds to the silicon atom in the main chain of the siloxane polymer. In PTL 1, the polymer is synthesized according to a dehydrative condensation method of hydrolyzing an arylamine-substituted chlorosilane.

PTL 2 describes a siloxane polymer having one arylamine unit as one pendant group, which has a linker (linking group) with 3 carbon atoms for linking the pendant group to the main chain thereof.

CITATION LIST

Patent Literature

PTL 1: JP-A-2000-80167
PTL 2: WO06/001874

SUMMARY OF INVENTION

Technical Problem

However, the siloxane polymers described in PTL 1 and PTL 2 are required to be improved in point of the film formability and the laminability thereof for the reason that the polymer chain is stiff since the pendant group directly bonds to the main chain therein and that the polymer is highly crystalline since the compact pendant groups stack together therein. In addition, the film to be obtained from the siloxane polymer is required to be improved in point of the film quality and in point of the characteristics (durability, and driving voltage) of the organic electroluminescence device having the film.

The present invention is to solve the existing problems mentioned above and to attain the following objects.

Specifically, an object of the invention is to provide an organic electroluminescence device material, which, in its production, is free from formation of impurities that worsen the performance of organic EL devices, which, in forming an upper layer by coating, does not cause dissolution mixing or swelling mixing, which forms a film of good quality and which contributes toward improving the performance (high durability, and low driving voltage) of organic EL devices.

Another object of the invention is to provide a film which is excellent in quality not causing dissolution mixing or swelling mixing in forming an upper layer by coating, and which contributes toward improving the performance of organic EL devices.

Still another object of the invention is to provide an organic electroluminescence device which is excellent in productivity and durability and takes a low driving voltage.

Solution to Problem

In consideration of the above-mentioned situation, the present inventors have assiduously studied and have reached the following knowledge.

Specifically, the inventors have found that, when a linker having at least 3 carbon atoms is introduced between the silicon atom in the main chain of a siloxane polymer and the arylamine unit in the polymer and when one pendant group contains at least two arylamine units each capable of functioning as a charge transporting site, then both the two requirements of film quality improvement and organic EL device performance improvement (high durability, and low driving voltage) can be satisfied.

More specifically, the solution to the above-mentioned problems includes the following:

[1]
An organic electroluminescence device material of a siloxane compound having a recurring unit represented by the following general formula (1):

[Chem. 1]

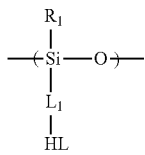

(In the general formula (1), $R_1$ represents an alkyl group or an aryl group; $L_1$ represents a divalent linking group having at least 3 carbon atoms; and HL represents a group containing at least two triarylamine units.)

[2]
The organic electroluminescence device material as claimed in [1], wherein HL in the general formula (1) is represented by the following general formula (2):

[Chem. 2]

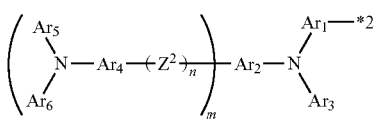

(In the general formula (2), each of $Ar_1$, $Ar_2$ and $Ar_4$ independently represents an arylene group; each of $Ar_3$, $Ar_5$ and $Ar_6$ independently represents an aryl group; $Z^2$ represents a divalent linking group; each of $Ar_4$, $Ar_5$, $Ar_6$ and $Z^2$ may be the same as or different from every other of them; n indicates the number of $Z^2$ in each triarylamine unit, and n is 0 or 1; m indicates the number of the recurring triarylamine units, and m is an integer of 1 or more; when m is 2 or more, then the triarylamine units bond to each other at $Ar_5$ of one triarylamine unit and $Z^2$ of the other triarylamine unit; when n=0 and m=1, then $Ar_2$ and $Ar_4$ bond to each other via a single bond; when n=0 and m is 2 or more, then $Ar_2$ and $Ar_4$ bond to each other via a single bond, and the triarylamine units bond to each other at $Ar_4$ of one triarylamine unit and $Ar_5$ of the other triarylamine unit via a single bond; *2 indicates the site at which the group bonds to $L_1$ in the general formula (1).

[3]
The organic electroluminescence device material as claimed in [1] or [2], wherein $L_1$ in the general formula (1) is represented by the following general formula (3):

[Chem. 3]

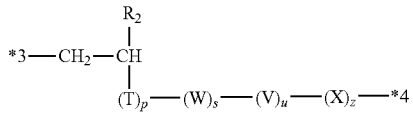

(In the general formula (3), $R_2$ represents a hydrogen atom or an alkyl group; T represents a divalent linking group; W represents an oxygen atom, —NH—, or a sulfur atom; V represents a divalent linking group; X represents —$CH_2$—, an oxygen atom, or —NH—; p indicates an integer of from 1 to 5; s indicates 0 or 1; u indicates an integer of from 0 to 5; z indicates 0 or 1; each of T and V may be the same as or different from every other of them; provided that any of T, V and X contains at least one carbon atom; *3 indicates the site at which the group bonds to the silicon atom in the general formula (1); and *4 indicates the site at which the group bonds to HL in the general formula (1).)

[4]
The organic electroluminescence device material as claimed in any one of [1] to [3], wherein the proportion of the recurring units containing Si—H to the total of the recurring units represented by the general formula (1) in the siloxane compound is from 0 to 10%.

[5]
The organic electroluminescence device material as claimed in any one of [1] to [4], wherein the siloxane compound is a 10- to 50-mer of the recurring unit represented by the general formula (1).

[6]
The organic electroluminescence device material as claimed in any one of [2] to [5], wherein the general formula (2) is represented by the following general formula (5):

[Chem. 4]

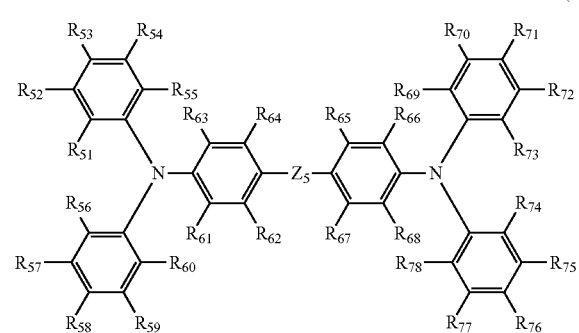

(In the general formula (5), each of $R_{51}$ to $R_{78}$ independently represents a hydrogen atom, an alkyl group, a cycloalkyl group, an alkoxy group, or a silyl group, provided that any one of $R_{51}$ to $R_{55}$ bonds to $L_1$ in the general formula (1); $Z_5$ represents a single bond or a divalent linking group.)

[7]

The organic electroluminescence device material as claimed in any one of [2] to [5], wherein the general formula (2) is represented by the following general formula (6):

[Chem. 5]

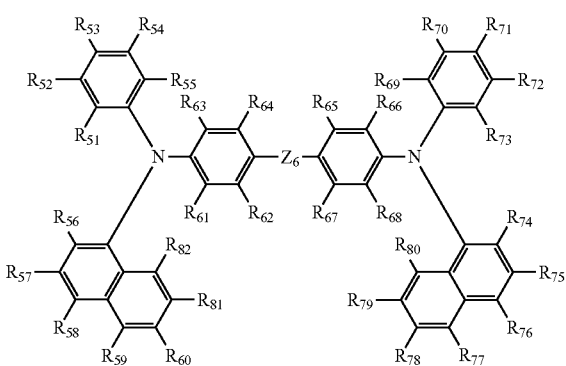

(6)

(In the general formula (6), each of $R_{51}$ to $R_{82}$ independently represents a hydrogen atom, an alkyl group, a cycloalkyl group, an alkoxy group, or a silyl group, provided that any one of $R_{51}$ to $R_{55}$ bonds to $L_1$ in the general formula (1); $Z_6$ represents a single bond or a divalent linking group.)

[8]

The organic electroluminescence device material as claimed in any one of [2] to [5], wherein the general formula (2) is represented by the following general formula (7):

[Chem. 6]

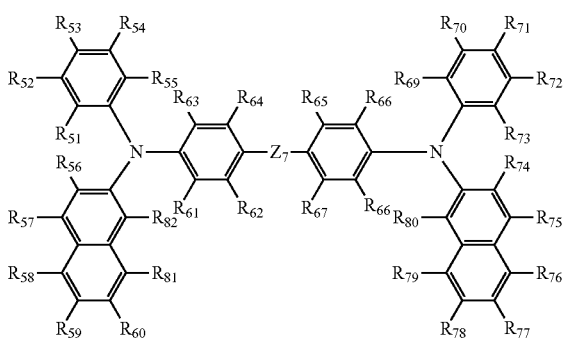

(7)

(In the general formula (7), each of $R_{51}$ to $R_{82}$ independently represents a hydrogen atom, an alkyl group, a cycloalkyl group, an alkoxy group, or a silyl group, provided that any one of $R_{51}$ to $R_{55}$ bonds to $L_1$ in the general formula (1); $Z_7$ represents a single bond or a divalent linking group.)

[9]

An organic electroluminescence device having, on a substrate, a pair of electrodes including an anode and a cathode, and at least one organic layer including a light emitting layer between the electrodes, wherein at least one organic layer between the anode and the light emitting layer contains the organic electroluminescence device material of any one of [1] to [8].

[10]

The organic electroluminescence device as claimed in [9], which contains the organic electroluminescence device material of any one of [1] to [8] in the hole injection layer therein.

[11]

The organic electroluminescence device as claimed in [9], which contains the organic electroluminescence device material of any one of [1] to [8] in the hole transport layer therein.

[12]

A method for producing an organic electroluminescence device stated in any one of [9] to [11], wherein a layer containing the organic electroluminescence device material of any one of [1] to [8] is formed according to a wet process.

[13]

A film containing the organic electroluminescence device material of any one of [1] to [8].

Advantageous Effects of Invention

According to the invention, there is provided an organic electroluminescence device material, which, in its production, is free from formation of impurities that worsen the performance of organic EL devices, which, in forming an upper layer by coating, does not cause dissolution mixing or swelling mixing, which forms a film of good quality and which contributes toward improving the performance (high durability, and low driving voltage) of organic EL devices.

Also according to the invention, there is provided a film which is excellent in quality not causing dissolution mixing or swelling mixing in forming an upper layer by coating, and which contributes toward improving the performance of organic EL devices.

Further according to the invention, there is provided an organic electroluminescence device which is excellent in productivity, which has a high luminous efficiency, and which takes a low driving voltage.

BRIEF DESCRIPTION OF DRAWING

The FIGURE This is a schematic view showing one example of the layer configuration of the organic electroluminescence device of the invention.

DESCRIPTION OF EMBODIMENTS

The invention is described in detail hereinunder. In this description, the numerical range expressed by the wording "a number to another number" means the range that falls between the former number indicating the lower limit of the range and the latter number indicating the upper limit thereof.

The organic electroluminescence device material of the invention is a siloxane compound having a recurring unit represented by the general formula (1) mentioned below.

[Siloxane Compound]

The siloxane compound in the invention has a recurring unit represented by the following general formula (1):

[Chem. 7]

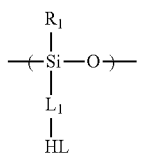

(1)

(In the general formula (1), $R_1$ represents an alkyl group or an aryl group; $L_1$ represents a divalent linking group having at least 3 carbon atoms; and HL represents a group containing at least two triarylamine units.)

In the general formula (1), $R_1$ represents an alkyl group or an aryl group.

The alkyl group is preferably an alkyl group having from 1 to 8 carbon atoms, more preferably an alkyl group having from 1 to 6 carbon atoms. Concretely, preferred are a methyl group, an ethyl group and a t-butyl group; more preferred is a methyl group and an ethyl group; and even more preferred is a methyl group.

The aryl group is preferably an aryl group having from 6 to 20 carbon atoms, more preferably from 6 to 12 carbon atoms, and concretely includes a phenyl group, a naphthyl group, a biphenyl group, an anthryl group, etc. Preferred are a phenyl group and a naphthyl group.

Preferably, $R_1$ is an alkyl group for the reason of improving the solubility in solvent and the film formability.

In the general formula (1), HL represents a group containing at least two triarylamine units (this may be referred to as a pendant group).

The siloxane compound in the invention has a pendant group containing triarylamine units of high crystallinity in the side chain of the siloxane main chain, and therefore it is considered that the amorphousness of the compound would be thereby increased to enhance the film formability thereof.

Preferably, HL is represented by the following general formula (2):

[Chem. 8]

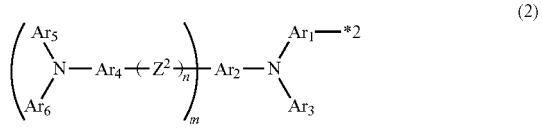

(2)

(In the general formula (2), each of $Ar_1$, $Ar_2$ and $Ar_4$ independently represents an arylene group; each of $Ar_3$, $Ar_5$ and $Ar_6$ independently represents an aryl group; $Z^2$ represents a divalent linking group; each of $Ar_4$, $Ar_5$, $Ar_6$ and $Z^2$ may be the same as or different from every other of them; n indicates the number of $Z^2$ in each triarylamine unit, and n is 0 or 1; m indicates the number of the recurring triarylamine units, and m is an integer of 1 or more; when m is 2 or more, then the triarylamine units bond to each other at $Ar_5$ of one triarylamine unit and $Z^2$ of the other triarylamine unit; when n=0 and m=1, then $Ar_2$ and $Ar_4$ bond to each other via a single bond; when n=0 and m is 2 or more, then $Ar_2$ and $Ar_4$ bond to each other via a single bond, and the triarylamine units bond to each other at $Ar_4$ of one triarylamine unit and $Ar_5$ of the other triarylamine unit via a single bond; *2 indicates the site at which the group bonds to $L_1$ in the general formula (1).)

In the general formula (2), each of $Ar_1$, $Ar_2$ and $Ar_4$ independently represents an arylene group. The arylene group is preferably an arylene group having from 6 to 20 carbon atoms, more preferably from 6 to 12 carbon atoms, and includes a phenylene group, a naphthylene group, a biphenylene group, a fluorenylene group, a phenanthrylene group, a pyrenylene group, a triphenylene group, etc. For the reason of increasing the pendant group introducing ratio and enhancing the charge transportability, preferred are a phenylene group, a naphthylene group, a biphenylene group, a fluorenylene group, a phenanthrylene group, etc.; and most preferred are a phenylene group and a naphthylene group.

In the general formula (2), each of $Ar_3$, $Ar_5$ and $Ar_6$ independently represents an aryl group. The aryl group is preferably an aryl group having from 6 to 20 carbon atoms, more preferably from 6 to 12 carbon atoms, and concretely includes a phenyl group, a naphthyl group, a biphenyl group, an anthryl group, a fluorenyl group, a phenanthryl group, a pyrenyl group, a triphenylenyl group, etc. For the reason of increasing the pendant group introducing ratio and enhancing the charge transportability, preferred are a phenyl group, a naphthyl group, a biphenyl group, a fluorenyl group, a phenanthryl group, etc.; and most preferred are a phenyl group and a naphthyl group.

In the general formula (2), the arylene group or the aryl group represented by $Ar_1$ to $Ar_6$ may have a non-polymerizing substituent. Preferably, the substituent includes an alkyl group (preferably an alkyl group having from 1 to 8 carbon atoms, more preferably an alkyl group having from 1 to 6 carbon atoms, even more preferably a methyl group, an ethyl group or a t-butyl group), a silyl group (preferably a silyl group substituted with an alkyl group having from 1 to 10 carbon atoms, more preferably a trimethylsilyl group), a halogen atom (preferably a fluorine atom), a cyano group, a cycloalkyl group (preferably a cyclohexyl group), an alkoxy group (preferably having from 1 to 20 carbon atoms, especially preferably a methoxy group or an ethoxy group), etc.

In the general formula (2), preferably, $Ar_1$, $Ar_2$ and $Ar_4$ each are a phenylene group, and $Ar_3$, $Ar_5$ and $Ar_6$ each are a phenyl group or a naphthyl group.

In the general formula (2), $Z^2$ represents a divalent linking group. The divalent linking group is preferably an alkylene group, a cycloalkylene group or a silylene group. The divalent linking group may have a substituent, and the substituent may be the same as the substituent which the arylene group or the aryl group represented by $Ar_1$ to $Ar_6$ may have.

The alkylene group represented by $Z^2$ is preferably an alkylene group having from 1 to 10 carbon atoms, and concretely includes a methylene group, an ethylene group, a propylene group, a butylene group, a pentylene group, a dimethylmethylene group, a diethylmethylene group, a diphenylmethylene group, etc. Preferred are a dimethylmethylene group, a diethylmethylene group, and a diphenylmethylene group.

The cycloalkylene group represented by $Z^2$ is preferably a cycloalkylene group having from 1 to 10 carbon atoms, and concretely includes a cyclopropylene group, a cyclobutylene group, a cyclopentylene group, a cyclohexylene group, a cycloheptylene group, etc. Preferred are a cyclopentylene group, a cyclohexylene group and a cycloheptylene group.

The silylene group represented by $Z^2$ is preferably a silylene group substituted with an alkyl group having from 1 to 10 carbon atoms or an aryl group having from 6 to 10 carbon atoms, more preferably a dimethylsilylene group, a diethylsilylene group or a diphenylsilylene group, and even more preferably a diphenylsilylene group.

In the general formula (2), n is 0 or 1. When n is 0, $Ar_2$ and $Ar_4$ bond to each other via a single bond. For the reason of broadening the conjugated system and enhancing the charge transportability, n is preferably 0.

In the general formula (2), m is an integer of 1 or more. m indicates the number of the recurring triarylamine units. When m is 2 or more, the triarylamine units bond to each other at $Ar_5$ and $Z^2$. From the viewpoint of satisfying both the charge transportability and the solubility in solvent, m is preferably an integer of from 1 to 9, more preferably an integer of from 1 to 5, even more preferably an integer of from 1 to 3.

When n=0 and m=1, $Ar_2$ and $Ar_4$ bond to each other via a single bond; and when n=0 and m is 2 or more, each of $Ar_2$ and $Ar_4$, and $Ar_4$ and $Ar_5$ bond to each other via a single bond.

When m is 2 or more, each $Z^2$ may be the same as or different from every other $Z^2$.

Preferably, the general formula (2) is represented by any of the following general formulae (5) to (7):

[Chem. 9]

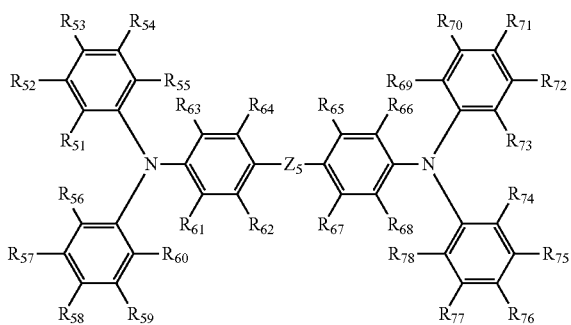

(5)

(In the general formula (5), each of $R_{51}$ to $R_{78}$ independently represents a hydrogen atom, an alkyl group, a cycloalkyl group, an alkoxy group, or a silyl group, provided that any one of $R_{51}$ to $R_{55}$ bonds to $L_1$ in the general formula (1); $Z_5$ represents a single bond or a divalent linking group.)

[Chem. 10]

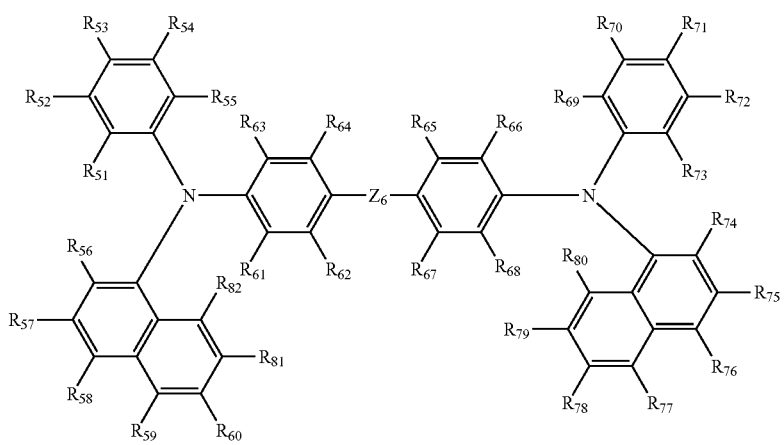

(6)

(In the general formula (6), each of $R_{51}$ to $R_{82}$ independently represents a hydrogen atom, an alkyl group, a cycloalkyl group, an alkoxy group, or a silyl group, provided that any one of $R_{51}$ to $R_{55}$ bonds to $L_1$ in the general formula (1); $Z_6$ represents a single bond or a divalent linking group.)

[Chem. 11]

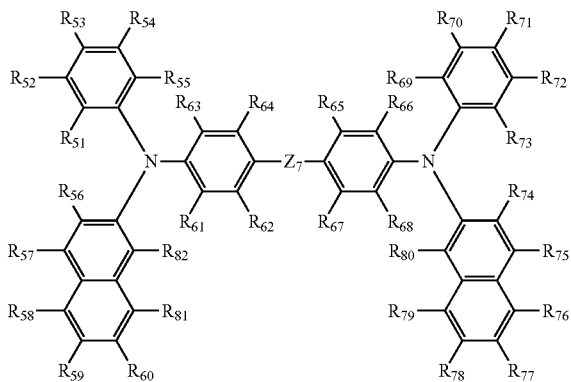

(7)

(In the general formula (7), each of $R_{51}$ to $R_{82}$ independently represents a hydrogen atom, an alkyl group, a cycloalkyl group, an alkoxy group, or a silyl group, provided that any one of $R_{51}$ to $R_{55}$ bonds to $L_1$ in the general formula (1); $Z_7$ represents a single bond or a divalent linking group.)

In the general formulae (5) to (7), each of $R_{51}$ to $R_{82}$ is a hydrogen atom, an alkyl group, a cycloalkyl group, an alkoxy group, or a silyl group.

The alkyl group is preferably an alkyl group having from 1 to 10 carbon atoms, more preferably an alkyl group having from 1 to 6 carbon atoms, even more preferably a methyl group, an ethyl group or a t-butyl group.

The cycloalkyl group is preferably a cycloalkyl group having from 3 to 10 carbon atoms, more preferably a cyclohexyl group or a cycloheptyl group.

The alkoxy group is preferably an alkoxy group having from 1 to 10 carbon atoms, more preferably a methoxy group or an ethoxy group.

The silyl group is preferably a silyl group substituted with an alkyl group having from 1 to 10 carbon atoms, more preferably a trimethylsilyl group.

In the general formulae (5) to (7), each of $R_{51}$ to $R_{82}$ is preferably a hydrogen atom or an alkyl group, more preferably a hydrogen atom.

In the general formulae (5) to (7), each of $Z_5$ to $Z_7$ represents a single bond or a divalent linking group. Specific examples and the preferred range of the divalent linking group are the same as those of $Z_2$ mentioned above. Each of $Z_5$ to $Z_7$ is preferably a single bond, an alkylene group, a cycloalkylene group or a silylene group, more preferably a single bond or a silylene group.

In the general formulae (5) to (7), any one of $R_{51}$ to $R_{55}$ bonds to $L_1$ in the general formula (1).

In the general formula (1), $L_1$ represents a divalent linking group having at least 3 carbon atoms. The "divalent linking group having at least 3 carbon atoms" is meant to indicate a divalent linking group that contains at least 3 carbon atoms in the main structure of the linking group. The "main structure of the linking group" indicates the atom or the atomic group to be used only for linking HL and the silicon atom in the general formula (1), and in particular, when the compound has multiple linking routes, that main structure of the linking group indicates the atom or the atomic group to constitute the route in which the number of the atoms used is the smallest.

The number of the carbon atoms contained in $L_1$ is at least 3. When the carbon number of $L_1$ is less than 3, then the compound is rigid and the flexibility of the side chain lowers and therefore the quality of the film to be formed of the siloxane compound worsens. In addition, when the carbon number of $L_1$ is less than 3, then the solubility of the siloxane compound in solvent lowers.

$L_1$ is an insulating site, and therefore, in consideration of the charge transportability of the siloxane compound, the carbon number of $L_1$ is preferably from 3 to 12, more preferably from 3 to 10, even more preferably from 3 to 7.

Using the siloxane compound in the invention provided an unexpected effect in point of organic EL device characteristics in that the driving voltage for the device greatly lowers. This would be because the pendant group having triarylamine units and the silicon atom of the siloxane main chain are linked by a linker having at least 3 carbon atoms, and therefore the compound thus has the rigid arylamine units as pendants via the flexible linker, by which the stacking of the arylamine units in the compound is increased to increase hole mobility.

The divalent linking group $L_1$ is preferably a divalent hydrocarbon group optionally containing an oxygen atom, a sulfur atom or a nitrogen atom, and more preferably a divalent group of an alkylene group, a cycloalkylene group, an arylene group or a combination of these groups optionally containing an oxygen atom, a sulfur atom or a nitrogen atom.

More preferably, $L_1$ is represented by the following general formula (3):

[Chem. 12]

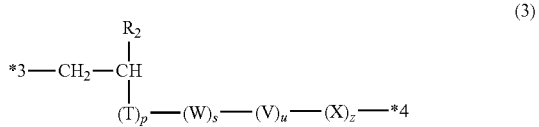

(3)

(In the general formula (3), $R_2$ represents a hydrogen atom or an alkyl group; T represents a divalent linking group; W represents an oxygen atom, —NH—, or a sulfur atom; V represents a divalent linking group; X represents —CH$_2$—, an oxygen atom, or —NH—; p indicates an integer of from 1 to 5; s indicates 0 or 1; u indicates an integer of from 0 to 5; z indicates 0 or 1; each of T and V may be the same as or different from every other of them; provided that any of T, V and X contains at least one carbon atom; *3 indicates the site at which the group bonds to the silicon atom in the general formula (1); and *4 indicates the site at which the group bonds to HL in the general formula (1).)

In the general formula (3), $R_2$ represents a hydrogen atom or an alkyl group. For the reason of the solubility in solvent and the charge transportability, the alkyl group is preferably an alkyl group having from 1 to 8 carbon atoms, more preferably an alkyl group having from 1 to 6 carbon atoms, and concretely, the alkyl group is preferably a methyl group, an ethyl group or a t-butyl group, more preferably a methyl group.

Especially preferably, $R_2$ is a hydrogen atom or a methyl group.

In the general formula (3), T represents a divalent linking group. The divalent linking group is preferably a divalent hydrocarbon group, more preferably an alkylene group, a cycloalkylene group, an arylene group, or a divalent group of a combination of these groups.

The alkylene group to be represented by T is preferably an alkylene group having from 1 to 10 carbon atoms, concretely including a methylene group, an ethylene group, a propylene group, a butylene group, a pentylene group, an octylene group, etc. For the reason of the solubility in solvent and the charge transportability, preferred are a methylene group, an ethylene group, a propylene group, a butylene group, a pentylene group, and a hexylene group.

The alkylene group may include a cycloalkylene group or an arylene group; and as the cycloalkylene group or the arylene group, there are mentioned the same as those of the cycloalkylene group or the arylene group to be represented by T to be mentioned below.

The cycloalkylene group to be represented by T concretely includes a cyclopropylene group, a cyclobutylene group, a cyclopentylene group, a cyclohexylene group, and a cycloheptylene group, and is preferably a cyclohexylene group.

The arylene group to be represented by T concretely includes a phenylene group, a naphthylene group, a biphenylene group, a fluorenylene group, a phenanthrylene group, a pyrenylene group, a triphenylenylene group, etc. Preferred are a phenylene group, a naphthylene group, and a biphenylene group.

T is preferably an alkylene group.

In the general formula (3), W represents an oxygen atom, —NH—, or a sulfur atom. For the reason of the chemical stability thereof, W is preferably an oxygen atom.

In the general formula (3), V represents a divalent linking group. Specific examples and the preferred range of V are the same as the specific examples and the preferred range of T mentioned above.

In the general formula (3), X represents —CH$_2$—, an oxygen atom, or —NH—. For the reason of the chemical stability thereof, X is preferably an oxygen atom.

In the general formula (3), p indicates an integer of from 1 to 5; s indicates 0 or 1; u indicates an integer of from 0 to 5; z indicates 0 or 1. When s is 0, then T and V bond to each other via a single bond. When u is 0, then W and X bond to each other via a single bond. When z is 0, then V directly bonds to HL in the general formula (1).

More preferably, $L_1$ is represented by the following general formula (3-1):

[Chem. 13]

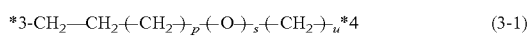

(3-1)

(In the general formula (3-1), p indicates an integer of from 1 to 5; s indicates 0 or 1; u indicates an integer of from 0 to 5; *3 indicates the site at which the group bonds to the silicon atom in the general formula (1); and *4 indicates the site at which the group bonds to HL in the general formula (1).)

Preferably, the total of p, s and u is from 1 to 10, more preferably from 1 to 6.

Preferably, the siloxane compound in the invention is a 10- to 50-mer of the recurring unit represented by the general formula (1), more preferably a 30- to 50-mer thereof. When the compound is larger than a 50-mer of the unit, then the solubility thereof in solvent may lower. When the compound is at least a 10-mer of the unit, it is good as not causing dissolution mixing or swelling mixing in forming the upper layer by coating.

The siloxane compound in the invention may contain any other structural unit than the structure represented by the above-mentioned general formula (1). The other structural unit which the compound may contain includes —(SiR$^{11}$R$^{12}$O)— unit. Each of R$^{11}$ and R$^{12}$ independently represent an alkyl group (preferably a methyl group).

In the siloxane compound of the invention, the content of the —(SiR$^{11}$R$^{12}$O)— unit is preferably at most 80 mol % relative to the total content of the structural unit represented by the general formula (1), more preferably at most 50 mol %, but even more preferably, the compound does not contain the —(SiR$^{11}$R$^{12}$O)— unit.

In the siloxane compound in the invention, preferably, the proportion of the recurring unit containing Si—H is from 0 to 20 mol % relative to the total of the recurring units represented by the general formula (1), for the reason of the possibility that the chemical stability of the compound may lower or the compound may react with impurities to give charge trap sites, more preferably from 0 to 10 mol %. In the siloxane compound in the invention, the recurring unit containing Si—H expresses the unreacted site in production of the siloxane compound to be mentioned below.

Preferably, the mass-average molecular weight (Mw) of the siloxane compound in the invention is from $10^3$ to $10^5$, more preferably from $10^4$ to $10^5$. The number-average molecular weight (Mn) of the siloxane compound in the invention is from $10^3$ to $10^5$, more preferably from $10^4$ to $10^5$. Mw and Mn of the siloxane compound in the invention may be measured through GPC. More precisely, tetrahydrofuran is used as a solvent and a polystyrene gel is used, and a converted molecular weight calibration curve is previously obtained from the calibration curve of standard monodispersed polystyrene, from which Mw and Mn of the siloxane compound are obtained. As the GPC apparatus, usable is HLC-8220GPC (by Tosoh).

The polydispersity (Mw/Mn) of the siloxane compound in the invention is preferably from 1.0 to 3.0, more preferably from 1.0 to 2.0.

[Method for Synthesis of Siloxane Compound]

The siloxane compound in the invention can be obtained through hydrosilylation of a polyalkylhydrosiloxane such as polymethylhydrosiloxane or the like or a polyarylhydrosiloxane with a monomer having at least 2 arylamine units and having a site to be a linking group having at least 3 carbon atoms.

The method of obtaining a siloxane polymer through hydrosilylation is excellent in the following point, as compared with a method of obtaining a siloxane polymer through dehydrative condensation with hydrolysis of a chlorosilane.

i) An unreacted hydroxyl group remains and the yield is high.

ii) The molecular weight distribution of the siloxane polymer is narrow, and the reproducibility of the method is high.

iii) A low-molecular cyclic siloxane is not formed. (In the production method of dehydrative condensation simultaneously with hydrolysis, a low-molecular cyclic siloxane is formed (Experimental Chemistry, 4th Ed., Vol. 28). The cyclic siloxane is highly volatile, and in a process of producing organic EL devices with the polymer, the low-molecular cyclic siloxane would diffuse as a vapor outside the devices. In addition, the cyclic siloxane decomposes with time into silicon dioxide, carbon dioxide and water, and there would be a serious risk of worsening the performance of the devices after produced.)

iv) No acid is formed. (Hydrolysis of chlorosilane gives hydrochloric acid, and this functions as an acid catalyst to initiate the polymerization (Experimental Chemistry, 4th Ed., Vol. 28). Under the acidic condition, the amine compound may decompose.)

A polyalkylhydrosiloxane or a polyarylhydrosiloxane can be obtained according to a generally-known dehydrative condensation method, and the molecular weight thereof can be controlled by controlling the reaction time and the reaction temperature. The end of the compound may be end-capped with a trialkylsilanol. Thus obtained, the polyalkylhydrosiloxane or the polyarylhydrosiloxane can be processed through partitioning GPC to thereby narrow the molecular weight distribution thereof to fall within a desired range.

The monomer having at least 2 arylamine units and a site to be a linking group having at least 3 carbon atoms is preferably a compound represented by the following general formula (4):

[Chem. 14]

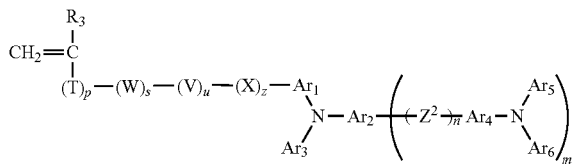

(4)

(In the general formula (4), R$_3$ represents a hydrogen atom or an alkyl group; T represents a divalent linking group; W represents an oxygen atom, —NH— or a sulfur atom; V represents a divalent linking group, X represents —CH$_2$—, an oxygen atom or —NH—; p indicates an integer of from 1 to 5; s indicates 0 or 1; u indicates an integer of from 0 to 5; z indicates 0 or 1; each of T and V may be the same as or different from every other of them; provided that any of T, V and X contains at least one carbon atoms; each of Ar$_1$, Ar$_2$ and Ar$_4$ independently represents an arylene group; each of Ar$_3$, Ar$_5$ and Ar$_6$ independently represents an aryl group; Z$^2$ represents a divalent linking group; each of Ar$_4$, Ar$_5$, Ar$_6$ and Z$^2$ may be the same as or different from every other of them; n indicates the number of Z$^2$ in each triarylamine unit, and n is 0 or 1; m indicates the number of the recurring triarylamine units, and m is an integer of 1 or more; when m is 2 or more, then the triarylamine units bond to each other at Ar$_5$ of one triarylamine unit and Z$^2$ of the other triarylamine unit; when n=0 and m=1, then Ar$_2$ and Ar$_4$ bond to each other via a single bond; when n=0 and m is 2 or more, then Ar$_2$ and Ar$_4$ bond to each other via a single bond, and the triarylamine units bond to each other at Ar$_4$ of one triarylamine unit and Ar$_5$ of the other triarylamine unit via a single bond.)

In the general formula (4), $R_3$, T, W, V, X, p, s, u and z are the same as $R_2$, T, W, V, X, p, s, u and z in the above-mentioned general formula (3). $Ar_1$, $Ar_2$ and $Ar_4$ are the same as $Ar_1$, $Ar_2$ and $Ar_4$ in the above-mentioned general formula (2). $Ar_3$, $Ar_5$ and $Ar_6$ are the same as $Ar_3$, $Ar_5$ and $Ar_6$ in the general formula (2). $Z^2$, n and m are the same as $Z^2$, n and m in the general formula (2).

Specific examples of the monomer compound represented by the general formula (4) are shown below, to which, however, the invention is not limited.

[Chem. 15]

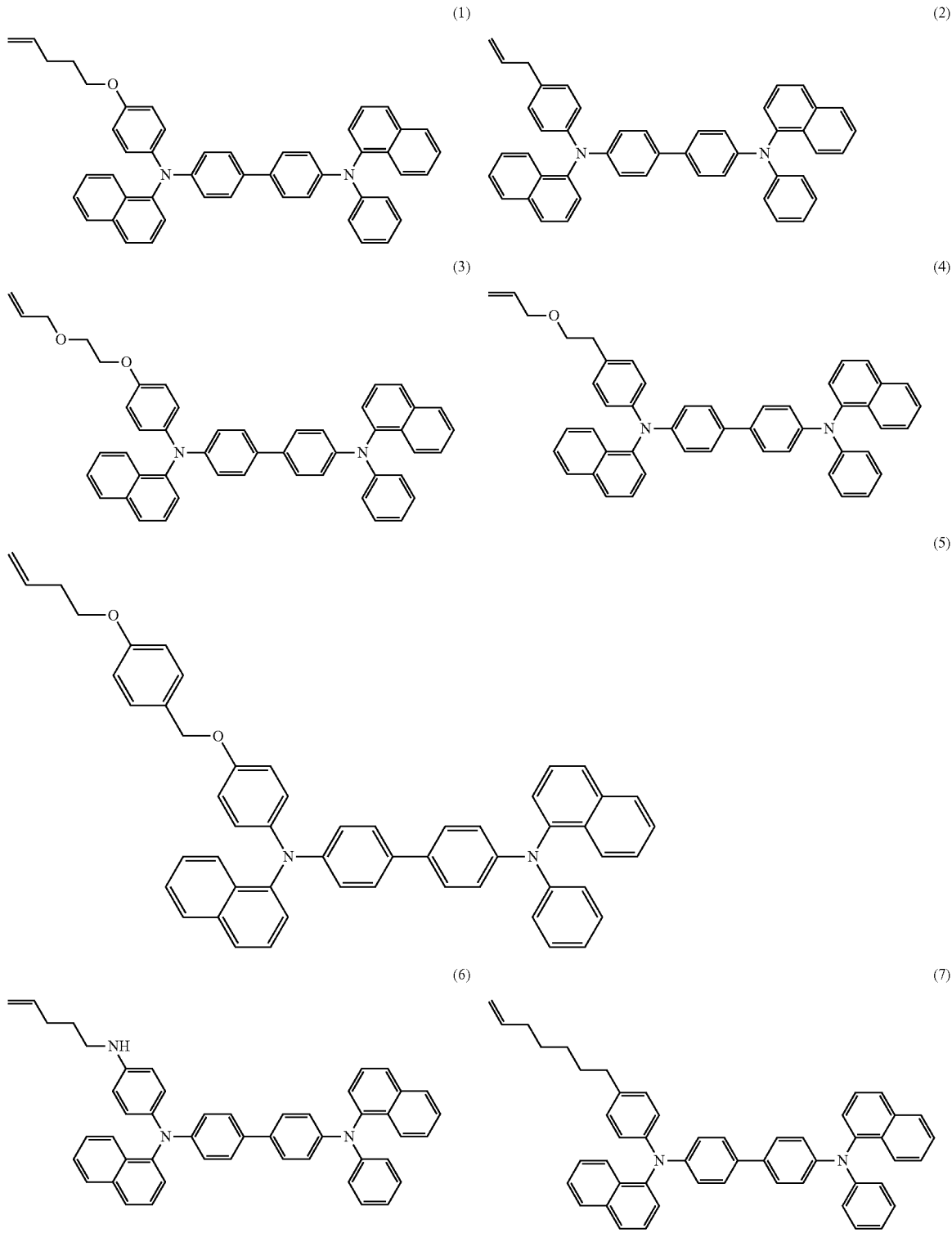

-continued
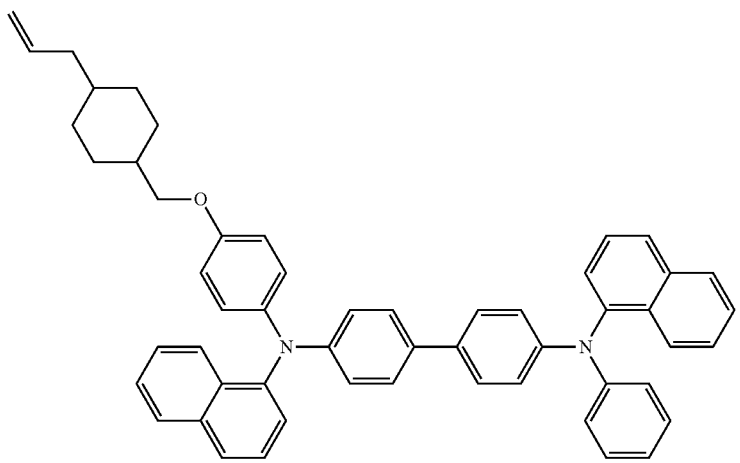
(8)
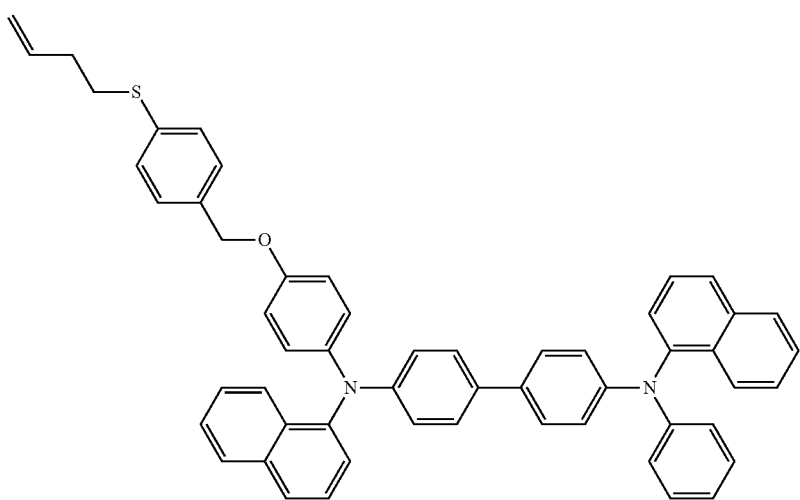
(9)
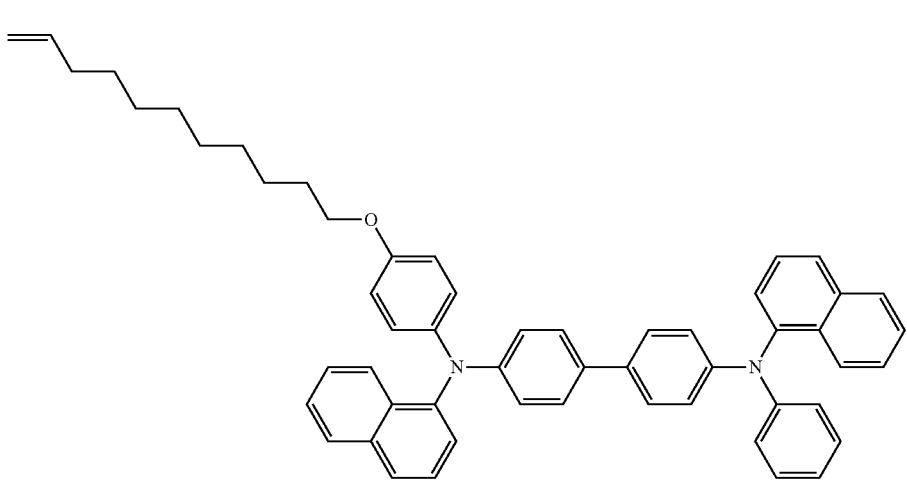
(10)

[Chem. 16]
(11) 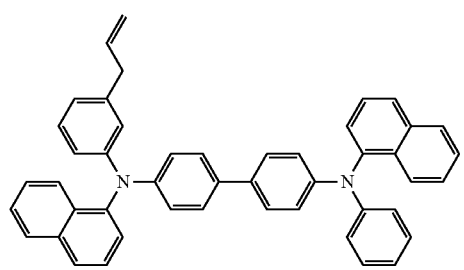
(12) 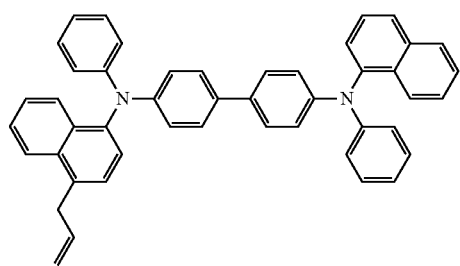
(13) 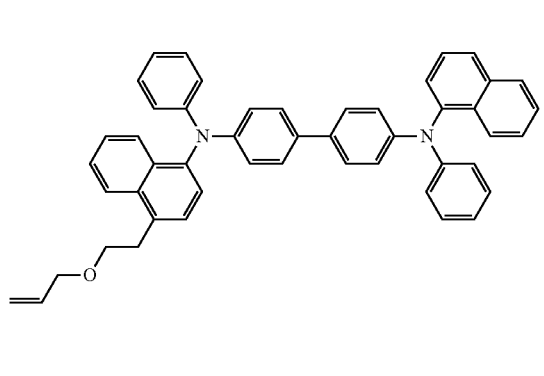
(14) 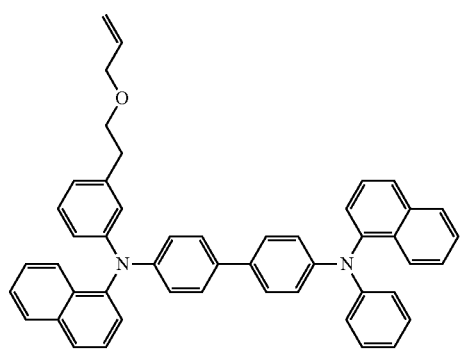
(15) 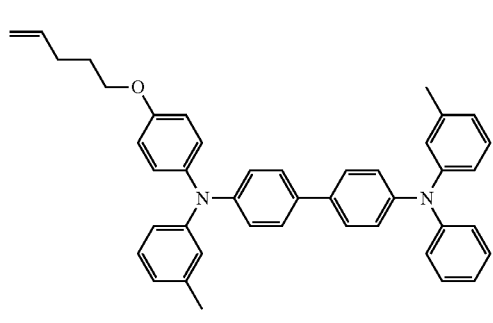
(16) 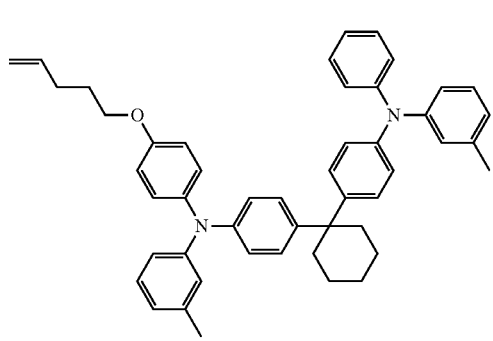
(17) 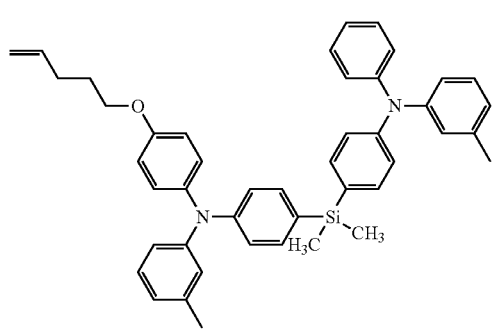
(18) 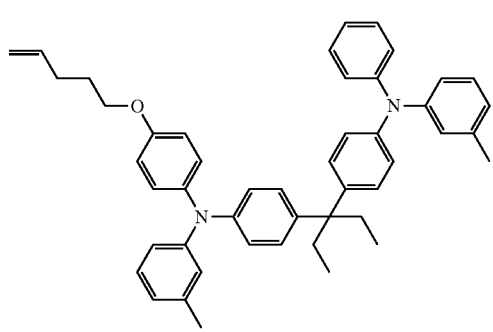

-continued
(19)
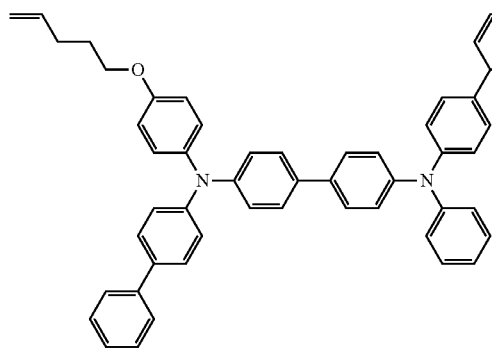
(20)
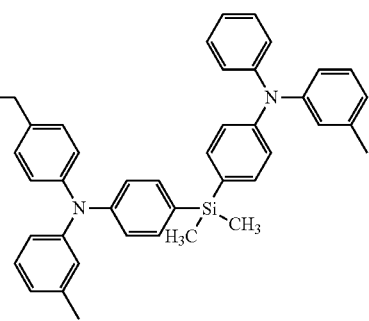
[Chem. 17]
(31)
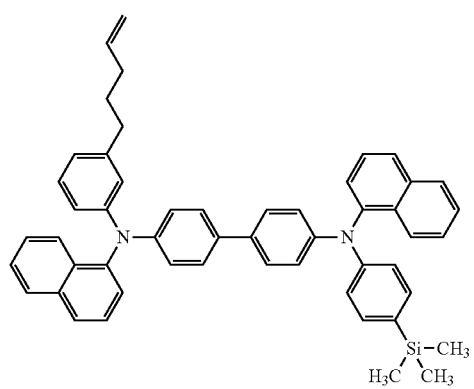
(32)
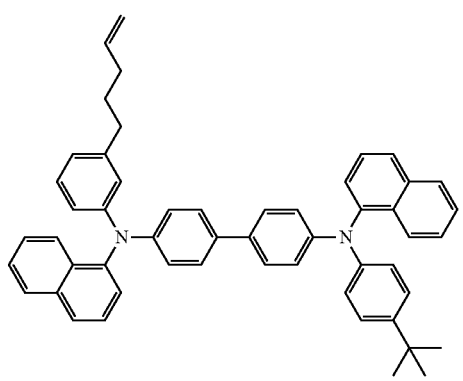
(33)
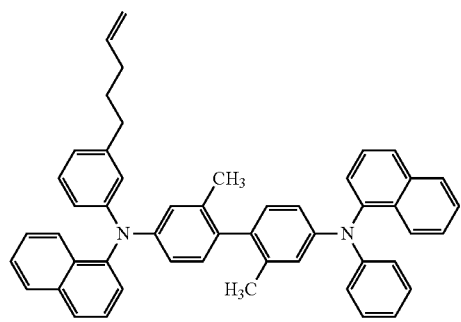
(34)
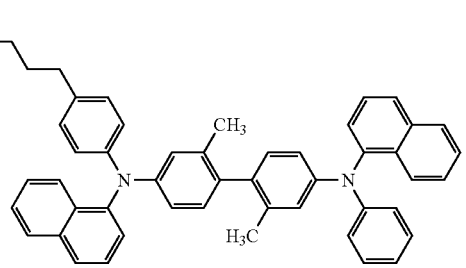
(35)
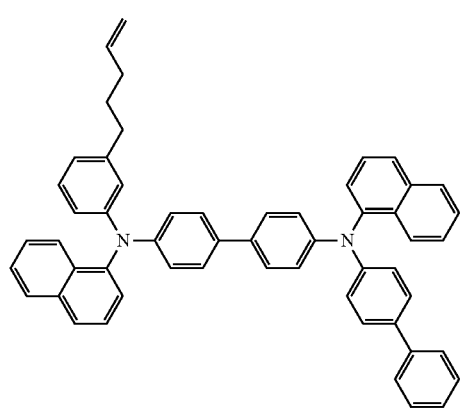
(36)
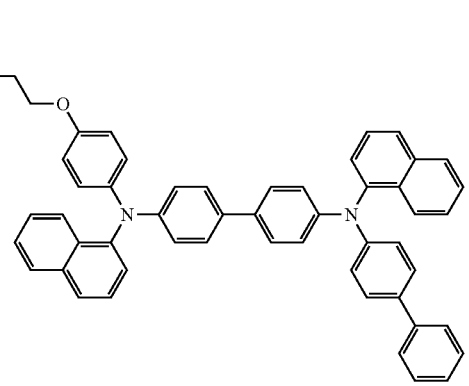

-continued
(37)
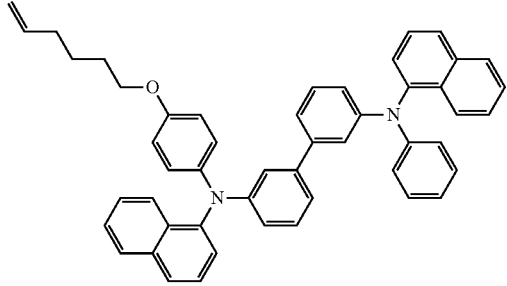
(38)
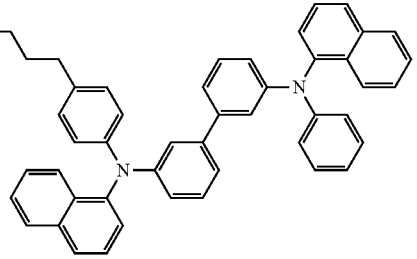
(39)
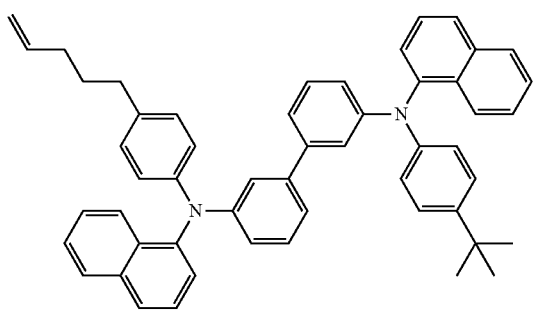
(40)
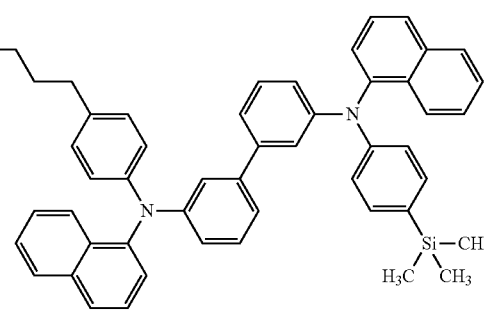
[Chem. 18]
(41)
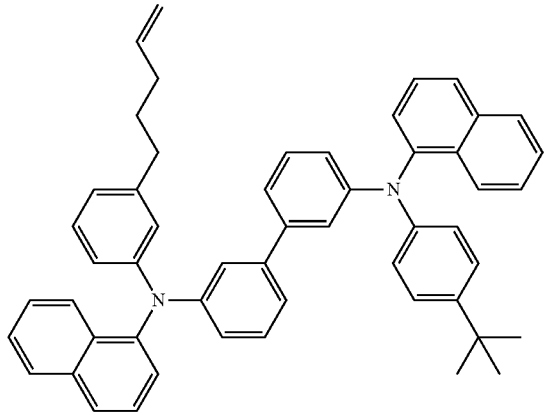
(42)
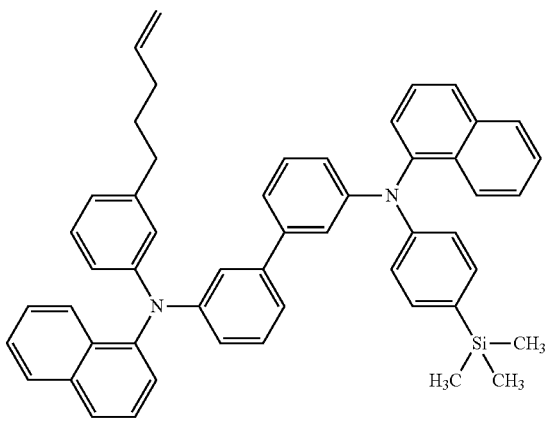
(43)
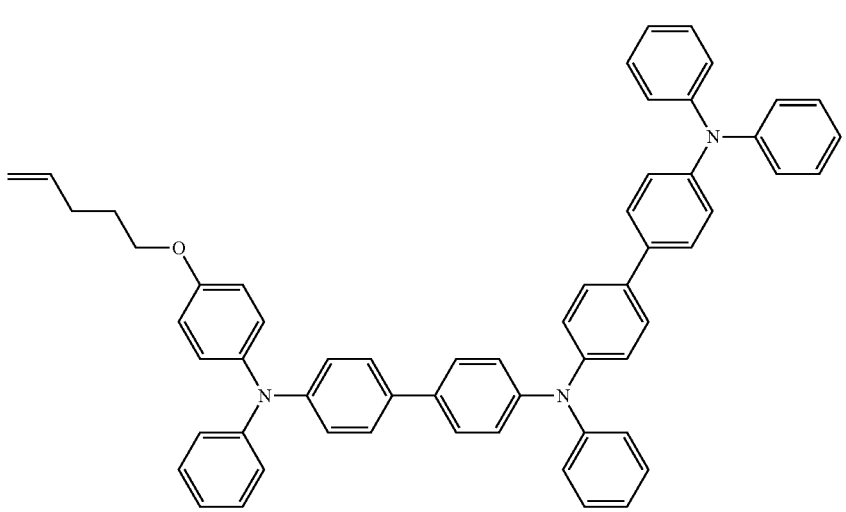

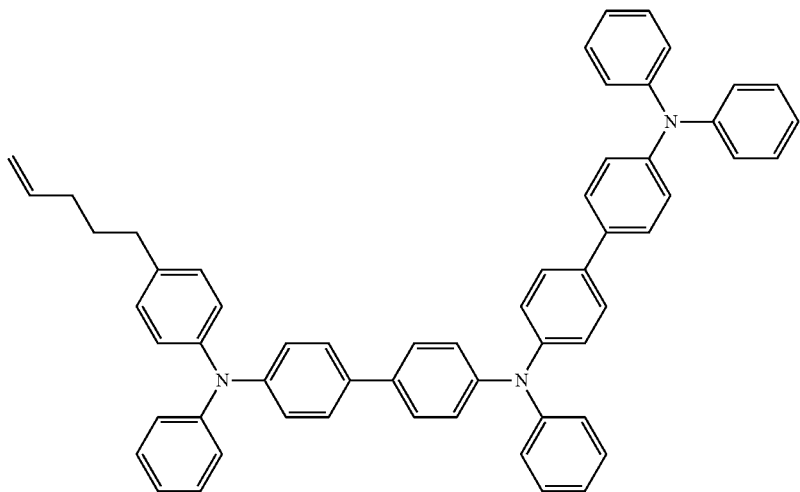
(44)
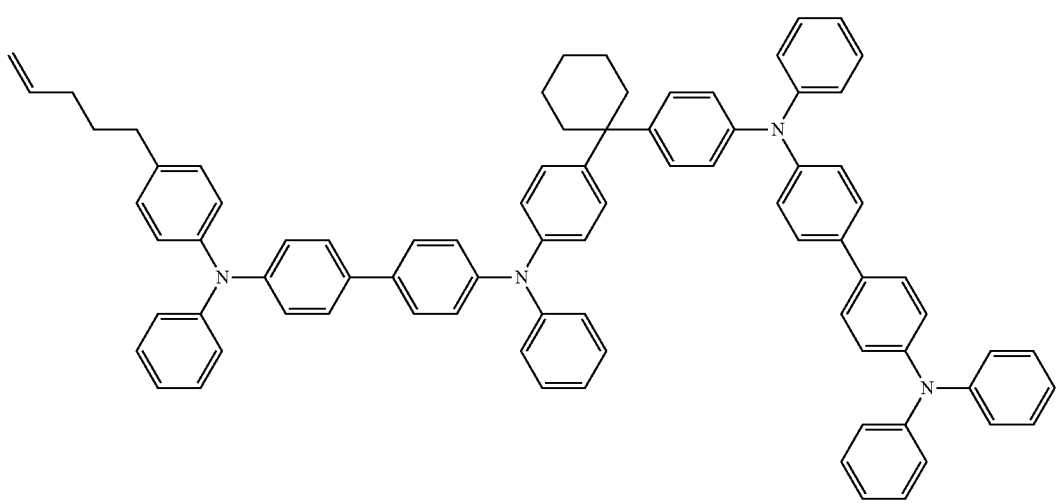
(45)
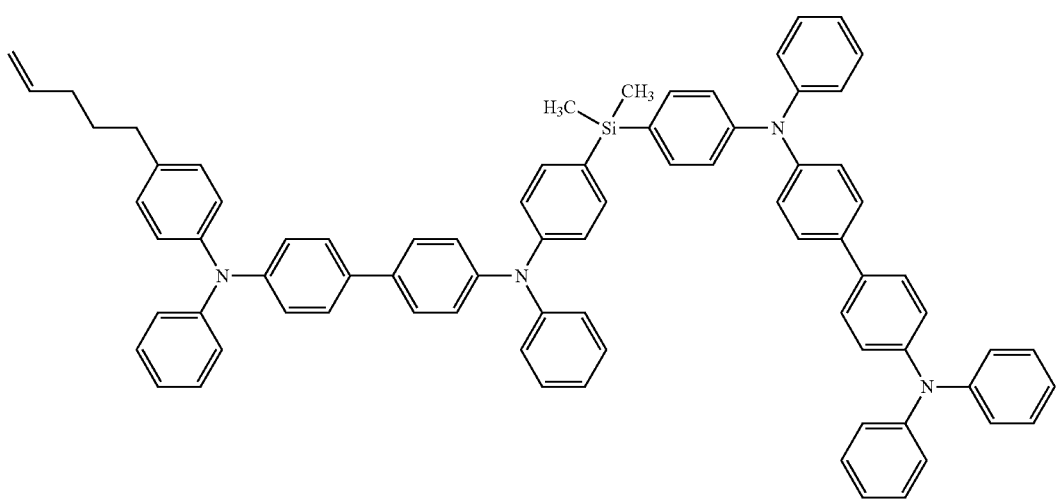
(46)

(47)
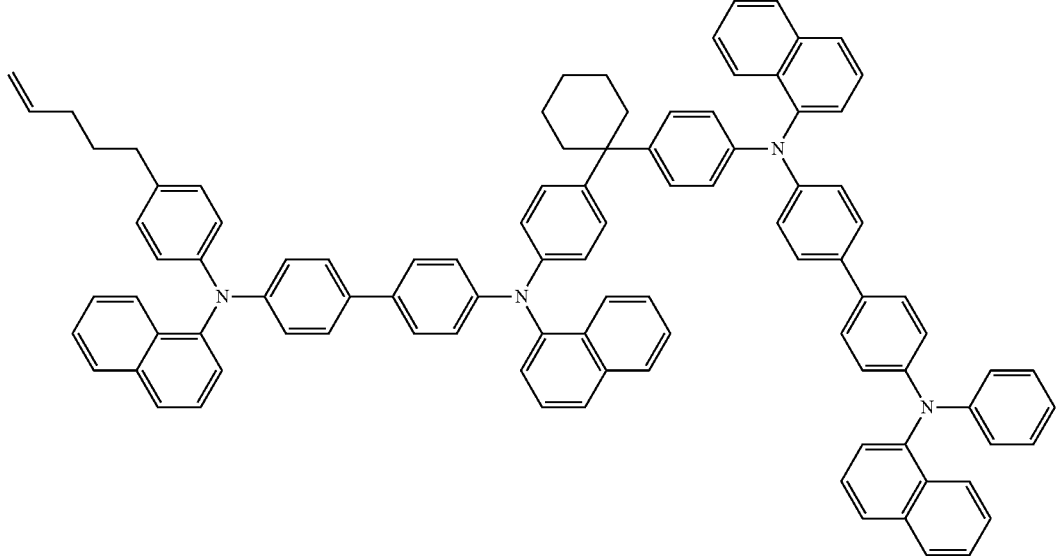
(48)
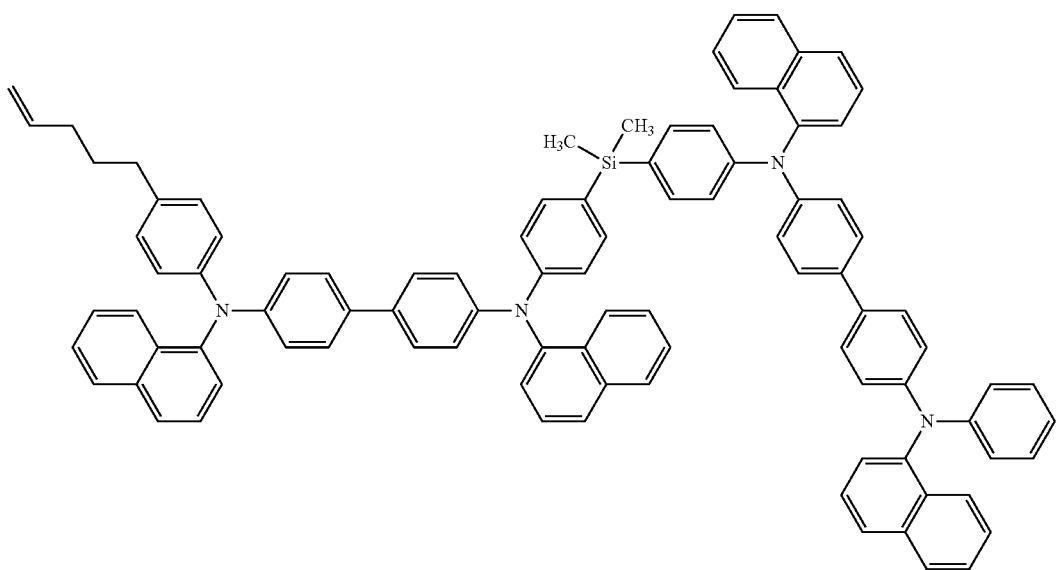
(49) (50)
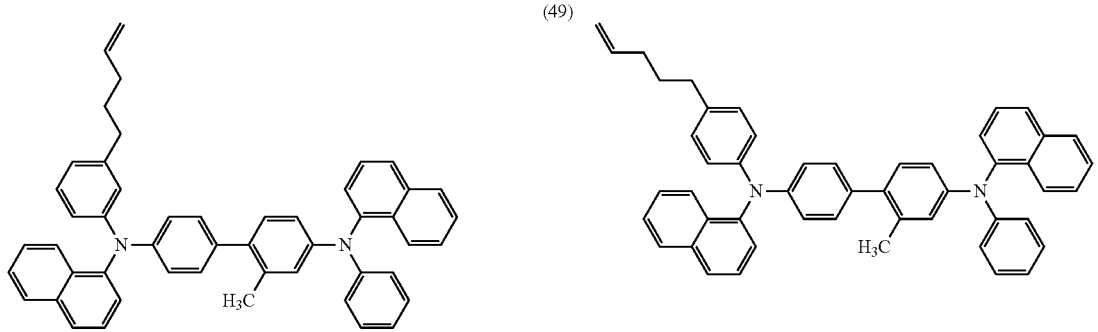

[Chem. 19]
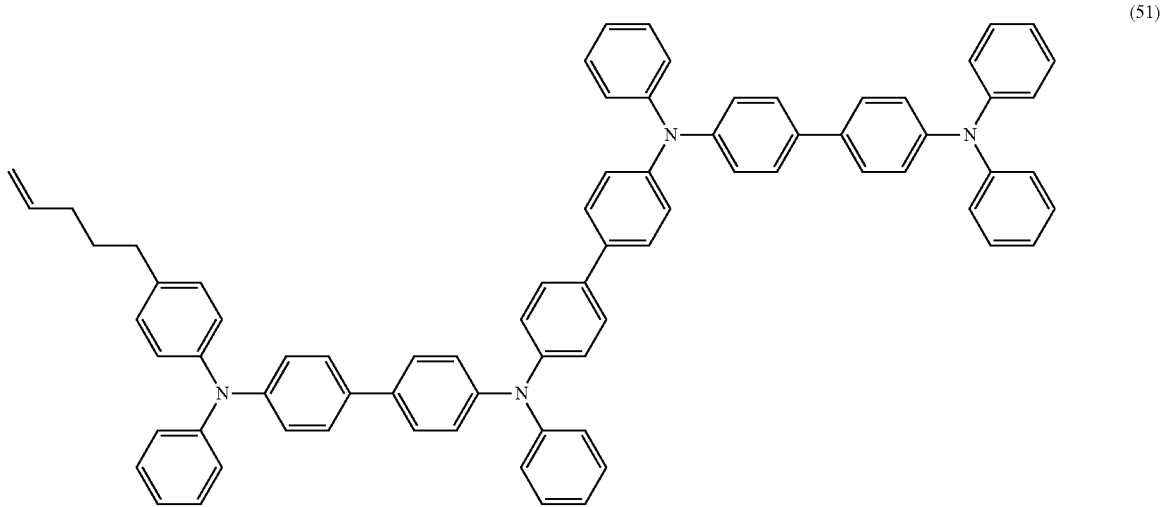
(51)
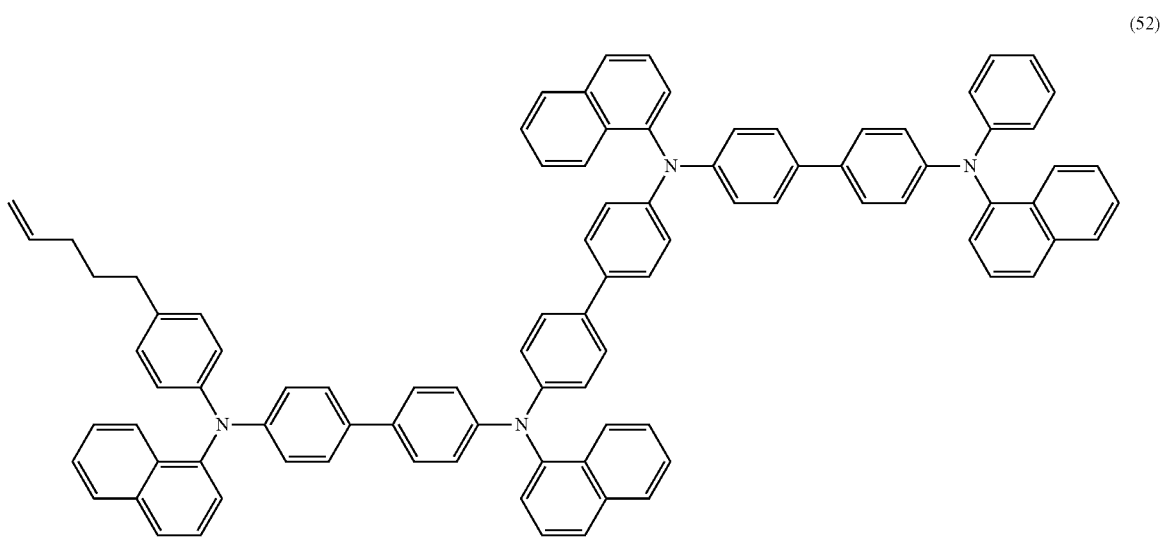
(52)
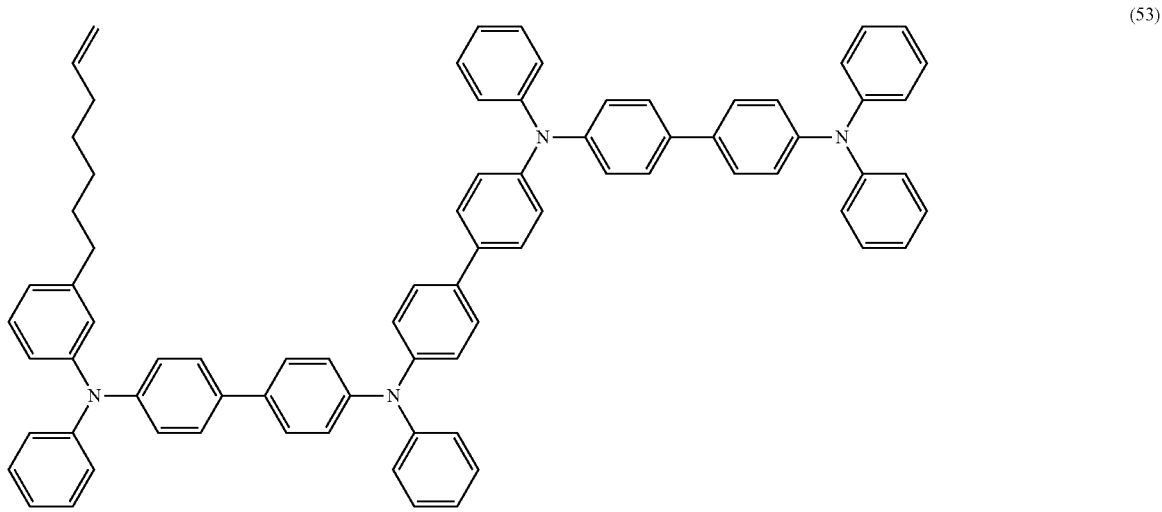
(53)

-continued
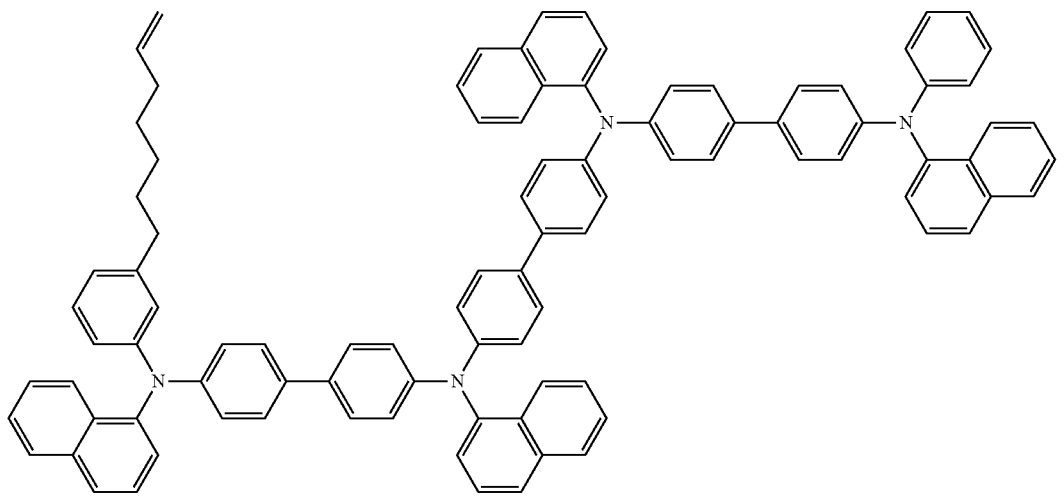
(54)
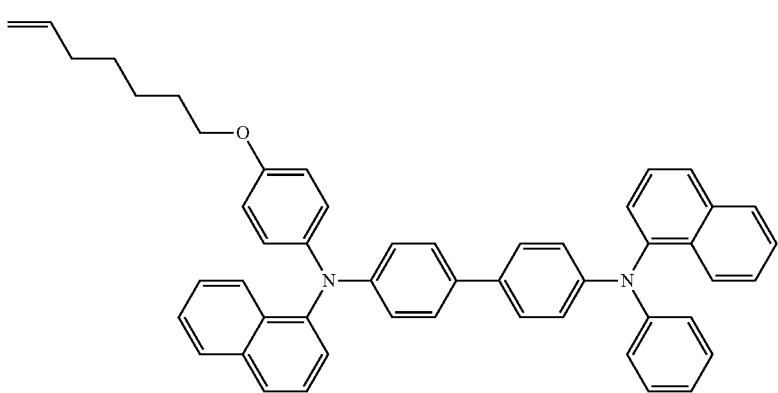
(55)
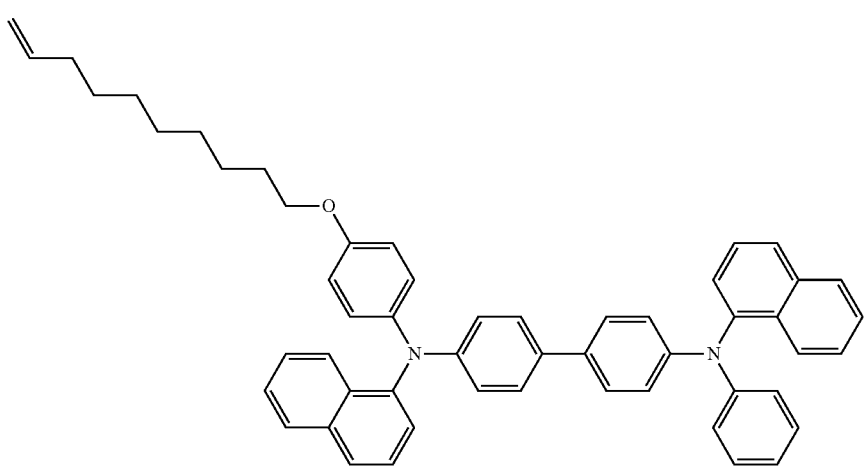
(56)

(57)

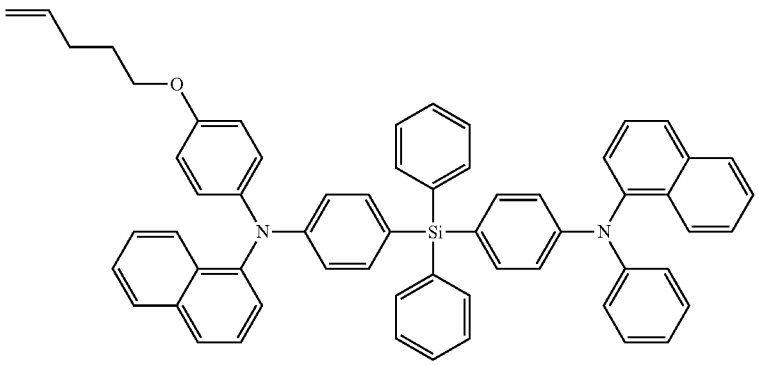

Regarding the blend ratio (by mol) of the compounds to be introduced into the reactor in producing the siloxane compound in the invention, preferably, the ratio of (polycondensate obtained through dehydrative condensation of the above-mentioned alkoxysilane)/(monomer compound represented by the general formula (4) is 1/1, more preferably 0.9/1, for the reason that it is desirable to reduce the proportion of the unreacted Si—H.

The reaction temperature in synthesis is preferably from 40 to 110° C., more preferably from 80 to 110° C. for the reason of the reactivity and the reaction in a homogeneous substrate system.

The reaction time is preferably from 3 hours to 48 hours, more preferably from 8 hours to 48 hours. The catalyst in the reaction is preferably a dicyclopentadienyl platinum catalyst. The solvent is preferably toluene.

In synthesis of the siloxane compound in the invention, a polymerization initiator is unnecessary, and therefore the invention is free from any negative influence of contamination with a polymerization initiator on organic electroluminescence devices.

In the invention, the use of the siloxane compound is not defined. The siloxane compound may be contained in any layer of the organic layer to be contained in an organic electroluminescence device. As the layer into which the siloxane compound is introduced, there are mentioned a light emitting layer, a hole injection layer, a hole transport layer, an electron transport layer, an electron injection layer, an exciton blocking layer, a charge blocking layer. Preferred is an organic layer between the light emitting layer and a anode; and more preferably, the compound is incorporated in a hole injection layer, a hole transport layer, or an electron blocking layer.

Preferably, the siloxane compound is incorporated in an amount of from 70 to 100% by mass relative to the total mass of the organic layer in which the siloxane compound is incorporated, more preferably from 85 to 100% by mass.

[Organic Electroluminescence Device]

The organic electroluminescence device of the invention is described in detail.

The organic electroluminescence device of the invention has, on a substrate, a pair of electrodes including an anode and a cathode, and at least one organic layer including a light emitting layer between the electrodes, wherein at least one organic layer between the anode and the light emitting layer contains the above-mentioned organic electroluminescence device material.

In the organic electroluminescence device of the invention, the light emitting layer is an organic layer, and the device contains at least one organic layer between the light emitting layer and the anode but may contain any other organic layer in addition to it.

In view of the properties of the luminescence device, preferably, at least one electrode of the anode and the cathode is transparent or semitransparent.

The FIGURE shows one example of the configuration of the organic electroluminescence device of the invention.

In the organic electroluminescence device 10 of the invention shown in the FIGURE, the light emitting layer 6 is sandwiched between the anode 3 and the cathode 9 on the supporting substrate 2. Concretely, the hole injection layer 4, the hole transport layer 5, the light emitting layer 6, the hole blocking layer 7 and the electron transport layer 8 are laminated in that order between the anode 3 and the cathode 9.

<Configuration of Organic Layer>

The layer configuration of the organic layer is not specifically defined, and may be suitably selected in accordance with the object and the use of the organic electroluminescence device. Preferably, the organic layer is formed on a transparent electrode or on a back electrode. In this case, the organic layer is formed on the entire surface or a part of the surface of the transparent electrode or the back electrode.

The shape, the size and the thickness of the organic layer are not specifically defined, and may be suitably selected in accordance with the object thereof.

Concrete layer configurations are mentioned below. however, the invention is not limited to these configurations.

Anode/hole transport layer/light emitting layer/electron transport layer/cathode Anode/hole transport layer/light emitting layer/blocking layer/electron transport layer/cathode Anode/hole transport layer/light emitting layer/blocking layer/electron transport layer/electron injection layer/cathode Anode/hole injection layer/hole transport layer/light emitting layer/electron transport layer/electron injection layer/cathode Anode/hole injection layer/hole transport layer/light emitting layer/blocking layer/electron transport layer/cathode Anode/hole injection layer/hole transport layer/light emitting layer/blocking layer/electron transport layer/electron injection layer/cathode The device configuration, the substrate, the cathode and the anode of organic electroluminescence devices are described in detail, for example, in JP-A-2008-270736, and the matters described in the patent publication are applicable to the present invention.

<Substrate>

The substrate for use in the invention is preferably a substrate which does not scatter or attenuate the light emitted by the organic layer. In case where the substrate is formed of an organic material, preferably, it is excellent in heat resistance, dimensional stability, solvent resistance, electric insulation and workability.

<Anode>

The anode may be, in general, any one capable of functioning as an anode of supplying holes to the organic layer, and the shape, the structure and the size thereof are not specifically defined. The anode may be suitably selected from any known electrode materials in accordance with the use and the object of the luminescence device. As described above, the anode is generally provided as a transparent anode.

<Cathode>

The anode may be, in general, any one capable of functioning as a cathode of injecting electrons into the organic layer, and the shape, the structure and the size thereof are not specifically defined. The cathode may be suitably selected from any known electrode materials in accordance with the use and the object of the luminescence device.

Regarding the substrate, the anode and the cathode, the matters described in JP-A-2008-270736, paragraphs [0070] to [0089] are applicable to the present invention.

<Organic Layer>

The organic layer in the invention is described.

[Formation of Organic Layer]

In the organic electroluminescence device of the invention, each organic layer can be formed favorably according to any one of a dry film formation method of a vapor deposition method, a sputtering method or the like, or a solution coating method of a transfer method, a printing method, a spin coating method, a bar coating method or the like.

Especially preferably, any one organic layer is formed according to a wet film formation method using the siloxane compound in the invention. The other layers may be formed according to a dry method or a wet method as suitably selected therefor. The wet method is preferred, in which a large-area organic layer can be formed with ease and a luminescence device having a high brightness and excellent in luminous efficiency can be produced at low cost and efficiently. As the dry method, usable is a vapor deposition method, a sputtering method or the like. As the wet method, usable is a dipping method, a spin coating method, a dip coating method, a casting method, a die coating method, a roll coating method, a bar coating method, a gravure coating method, a spray coating method, an inkjet method or the like. These film formation methods may be suitably selected in accordance with the material of the organic layer to be formed. In case where the layer is formed according to a wet film formation method, the film may be dried after formed. For the drying, the conditions of temperature, pressure and others are suitably selected so that the coating film is not damaged.

The invention also relates to a film that contains the siloxane compound in the invention.

The coating liquid for use in the wet film formation method generally comprises the material of the organic layer and the solvent to dissolve or disperse the material. The solvent is not specifically defined, and may be suitably selected in accordance with the material for the organic layer. Specific examples of the solvent include halogen solvents (chloroform, carbon tetrachloride, dichloromethane, 1,2-dichloroethane, chlorobenzene, etc.), ketone solvents (acetone, methyl ethyl ketone, diethyl ketone, n-propyl methyl ketone, cyclohexanone, etc.), aromatic solvents (benzene, toluene, xylene, etc.), ester solvents (ethyl acetate, n-propyl acetate, n-butyl acetate, methyl propionate, ethyl propionate, γ-butyrolactone, diethyl carbonate, etc.), ether solvents (tetrahydrofuran, dioxane, etc.), amide solvents (dimethylformamide, dimethylacetamide, etc.), dimethyl sulfoxide, alcohol solvents (methanol, propanol, butanol, etc.), water, etc.

As the solvent for the above-mentioned siloxane compound in the invention, preferred are, of the above, the ketone solvents, the aromatic solvents, the ester solvents, the ether solvents, or the alcohol solvents.

The ratio of the solid content to the solvent in the coating liquid is not specifically defined, and may be suitably selected in accordance with the viscosity of the coating liquid and the film formation method.

[Light Emitting Layer]

In the organic electroluminescence device of the invention, the light emitting layer contains a light emitting material, and the light emitting material preferably contains a phosphorescent compound. Not specifically defined, the phosphorescent compound may be any one capable of emitting light from the triplet exciton. As the phosphorescent compound, preferably used is an ortho-metalated complex or a porphyrin complex. More preferred is an ortho-metalated complex. Of the porphyrin complex, more preferred is a porphyrin platinum complex. One alone or two or more different types of phosphorescent compounds may be used here either singly or as combined.

The ortho-metalated complex as referred to in the invention is an inclusive term of compounds described in Akio Yamamoto, "Organometallic Chemistry, Principles and Applications", pp. 150 and 232, by Shokabo Publishing (1982); H. Yersin, "Photochemistry and Photophysics of Coordination Compounds", pp. 71-77 and 135-146, by Springer-Verlag (1987), etc. The ligand to form the ortho-metalated complex is not specifically defined, but preferred are 2-phenylpyridine derivatives, 7,8-benzoquinoline derivatives, 2-(2-thienyl)pyridine derivatives, 2-(1-naphthyl)pyridine derivatives or 2-phenylquinoline derivatives. These derivatives may have a substituent. In addition to the ligand indispensable for the formation thereof, the ortho-metalated complex may have any other ligand. The center atom to form the ortho-metalated complex may be any transition metal, but in the invention, preferred is rhodium, platinum, gold, iridium, ruthenium, palladium or the like. Above all, especially preferred is iridium. The organic layer containing such an ortho-metalated complex is excellent in brightness and luminous efficiency. Specific examples of ortho-metalated complexes are described in JP-A-2002-319491, paragraphs [0201] to [0231].

The ortho-metalated complex for use in the invention can be produced according to known methods described in Inorg. Chem., 30, 1685, 1991; Inorg. Chem., 27, 3464, 1988; Inorg. Chem., 33, 545, 1994; Inorg. Chim. Acta, 181, 245, 1991; J. Organomet. Chem., 335, 293, 1987; J. Am. Chem. Soc., 107, 1431, 1985, etc.

The content of the phosphorescent compound in the light emitting layer is not specifically defined. For example, the content may be from 0.1 to 70% by mass, preferably from 1 to 20% by mass. When the content of the phosphorescent compound is less than 0.1% by mass, or more than 70% by mass, then the compound could not sufficiently exhibit its effect.

In the invention, the light emitting layer may contain a host compound, if desired.

The host compound is a compound that undergoes energy transportation from the excited state thereof to a phosphorescent compound to thereby induce light emission from the phosphorescent compound. Specific examples of the host compound include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene compounds, porphyrin compounds, anthraquinodimethane derivatives, anthrone derivatives, diphenylquinone derivatives, thiopyran dioxide derivatives, carbodiimide derivatives, fluorenylidenemethane derivatives, distyrylpyrazine derivatives, heterocyclic tetracarboxylic acid anhydrides such as naphthaleneperylene and the like, phthalocyanine derivatives, 8-quinolinol derivative metal complexes, metal phthalocyanines, metal complexes having benzoxazole, benzothiazole or the like as the ligand, polysilane compounds, poly(N-vinylcarbazole) derivatives, aniline copolymers, electroconductive polymers such as thiophene oligomers, polythiophene and the like, polythiophene derivatives, polyphenylene derivatives, polyphenylenevinylene derivatives, polyfluorene derivatives, etc. One alone or two or more different types of the host compounds may be used here either singly or as combined.

Preferably, the thickness of the light emitting layer is from 10 to 200 nm, more preferably from 20 to 80 nm. When the thickness is more than 200 nm, then the driving voltage may increase; but when less than 10 nm, the layer may cause short circuit in luminescence devices.

(Hole Injection Layer, Hole Transport Layer)

The organic electroluminescence device of the invention may have a hole injection layer and a hole transport layer. The hole injection layer and the hole transport layer are layers having the function of receiving holes from the anode or the anode side to transport them to the cathode side.

The hole injection layer and the hole transport layer are described in detail, for example, in JP-A-2008-270736 and JP-A-2007-266458, and the matters described in these patent publications are applicable to the present invention.

Preferably, the hole injection layer, the hole transport layer or the electron blocking layer contains the above-mentioned siloxane compound in the invention.

(Electron Injection Layer, Electron Transport Layer)

The organic electroluminescence device of the invention may have an electron injection layer and an electron transport layer. The electron injection layer and the electron transport layer are layers having the function of receiving electrons from the cathode or the cathode side to transport them to the anode side. The electron injection material and the electron transport material for use for these layers may be low-molecular compounds or polymer compounds.

The electron injection layer and the electron transport layer are described in detail, for example, in JP-A-2008-270736 and JP-A-2007-266458, and the matters described in these patent publications are applicable to the present invention.

(Hole Blocking Layer)

The hole-blocking layer is a layer having a function of preventing the holes transported from the anode side to the light-emitting layer from passing through to the cathode side. In the invention, the hole-blocking layer can be provided as an organic layer contiguous to the light-emitting layer on the cathode side.

As the examples of organic compounds for constituting the hole-blocking layer, aluminum complexes such as aluminum(III)bis(2-methyl-8-quinolinato)-4-phenylphenolate (abbreviated to BAlq), triazole derivatives, phenanthroline derivatives such as 2,9-dimethyl-4,7-diphenyl-1,10-phenanthroline (abbreviated to BCP), triphenylene derivatives and carbazole derivatives can be exemplified.

Preferably, the thickness of the hole blocking layer is from 1 nm to 500 nm, more preferably from 5 nm to 200 nm, even more preferably from 10 nm to 100 nm.

The hole blocking layer may have a single-layer structure of one or more of the above-mentioned materials, or may have a multilayer structure of multiple layers each having the same composition or a different composition.

(Electron-Blocking Layer)

The electron-blocking layer is a layer having a function of preventing the electrons transported from the cathode side to the light-emitting layer from passing through to the anode side. In the invention, the electron-blocking layer can be provided as an organic layer contiguous to the light-emitting layer on the anode side.

As the examples of organic compounds for constituting the electron-blocking layer, for example, the hole-transporting materials described above can be applied.

The thickness of the electron-blocking layer is preferably 1 nm to 500 nm, more preferably 5 nm to 200 nm, and still more preferably 10 nm to 100 nm.

The electron-blocking layer may have a monolayer structure containing one or two or more kinds of the above materials, or may be a multilayer structure comprising two or more layers of the same composition or different compositions.

[Other Organic Layers]

The organic electroluminescence device of the invention may have a protective layer such as that described in JP-A-7-85974, 7-192866, 8-22891, 10-275682, 10-106746, etc. The protective layer is formed on the outermost surface of the luminescence device. The outermost surface as referred to herein is meant to indicate the outer surface of the back electrode in the device where a substrate, a transparent electrode, an organic layer and a back electrode are laminated in that order, or to indicate the outer surface of the transparent electrode in the device where a substrate, a back electrode, an organic layer and a transparent electrode are laminated in that order. The form, the size and the thickness of the protective layer are not specifically defined. Also not specifically defined, the material to form the protective layer may be any one having the function of preventing moisture, oxygen and the like to deteriorate luminescence devices from invading or penetrating into the device, and includes silicon oxide, silicon dioxide, germanium oxide, germanium dioxide, etc.

The method for forming the protective layer is not specifically defined. For example, the layer may be formed according to a vacuum evaporation method, a sputtering method, a reactive sputtering method, a molecular beam epitaxial method, a cluster ion beam method, an ion plating method, a plasma polymerization method, a plasma CVD method, a laser CVD method, a thermal CVD method, a coating method, etc.

[Sealant Layer]

Preferably, a sealant layer is provided in the organic electroluminescence device for preventing moisture or oxygen from invading the device. The material to form the sealant layer includes copolymers of tetrafluoroethylene and at least one comonomer; fluorine-containing polymers having a cyclic structure in the copolymerized main chain; polyethylene, polypropylene, polymethyl methacrylate, polyimide, polyurea, polytetrafluoro ethylene, polychlorotrifluoro ethylene, polydichlorodifluoroethylene; copolymers of chlorotrifluoroethylene or dichlorodifluoroethylene and any other comonomer; water absorbing substances having a water absorption of at least 1%; moisture-proof substances having a water absorption of at most 0.1%; metals (In, Sn, Pb, Au, Cu, Ag, Al, Tl, Ni, etc.); metal oxides (MgO, SiO, $SiO_2$, $Al_2O_3$, GeO, NiO, CaO, BaO, $Fe_2O_3$, $Y_2O_3$, $TiO_2$, etc.); metal fluorides ($MgF_2$, LiF, $AlF_3$, $CaF_2$, etc.); liquid fluorocarbons (perfluoroalkanes, perfluoroamines, perfluoroethers, etc.); dispersions prepared by dispersing a moisture or oxygen adsorbent in such liquid fluorocarbons, etc.

The organic electroluminescence device of the invention can emit light when a direct current (optionally containing an alternating current component) voltage (generally from 2 volts to 15 volts), or a direct current is applied between the anode and the cathode therein.

Regarding the driving method for the organic electroluminescence device of the invention, the driving methods described in JP-A-2-148687, 6-301355, 5-29080, 7-134558, 8-234685, 8-241047, Japanese Patent 2784615, U.S. Pat. Nos. 5,828,429, 6,023,308, and others are applicable to the invention.

EXAMPLES

The invention is described more concretely with reference to the following Examples. In the following Examples, the material and the reagent used, their amount and ratio, the details of the treatment and the treatment process may be suitably modified or changed not overstepping the spirit and the scope of the invention. Accordingly, the scope of the invention should not be restricted by the Examples mentioned below.

Example 1

Synthesis of Siloxane Polymer

Monomer compounds 1e, 1f, 1g, 1 h, 1n and 1s were synthesized according to the following scheme.

[Chem. 20]

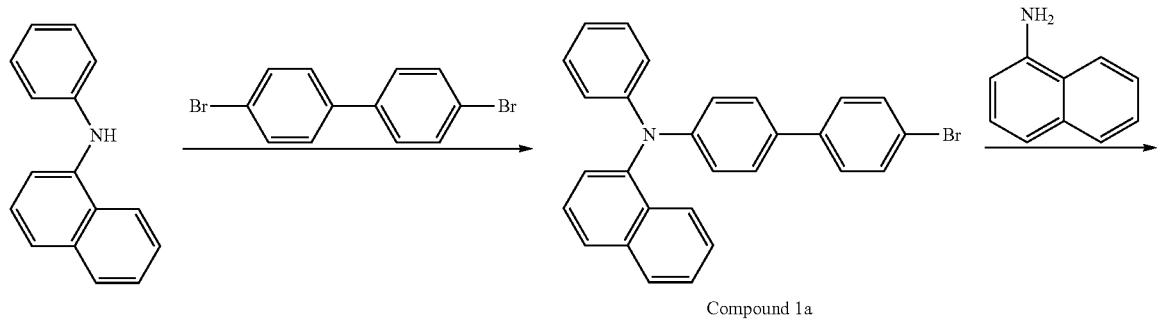

Compound 1a

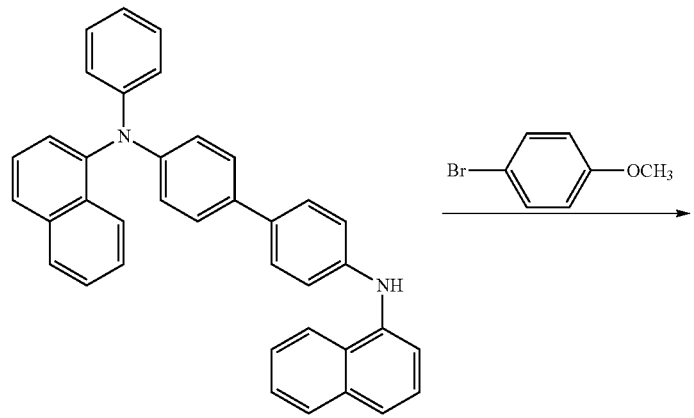

Compound 1b

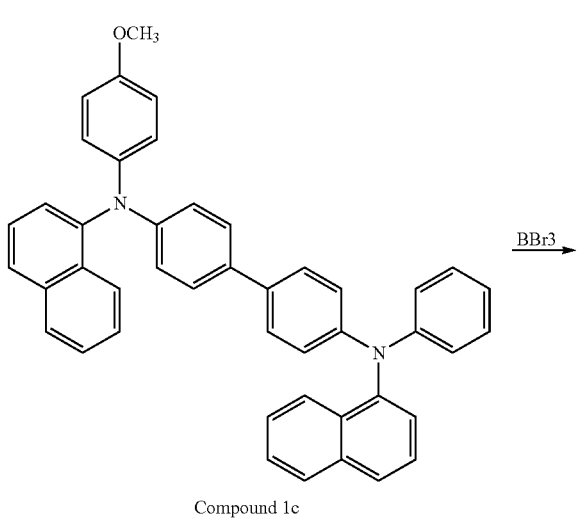

Compound 1c

-continued
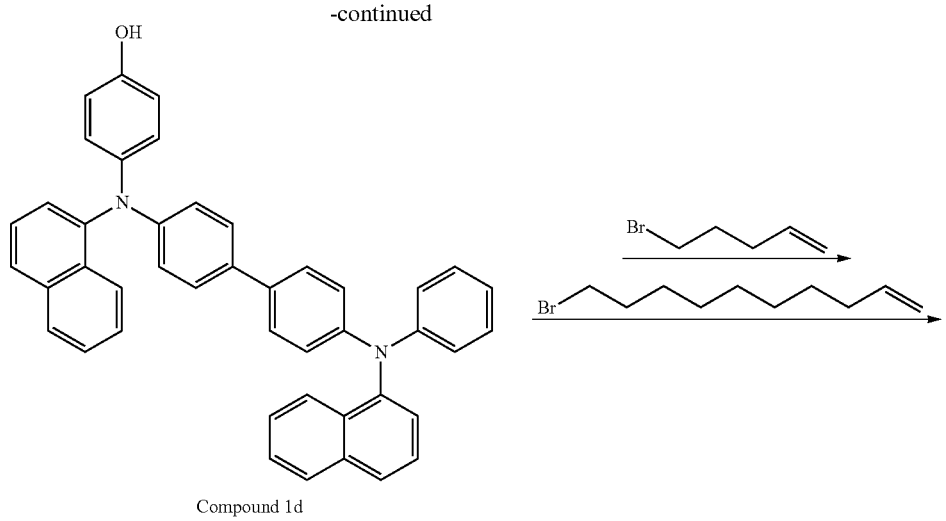
Compound 1d
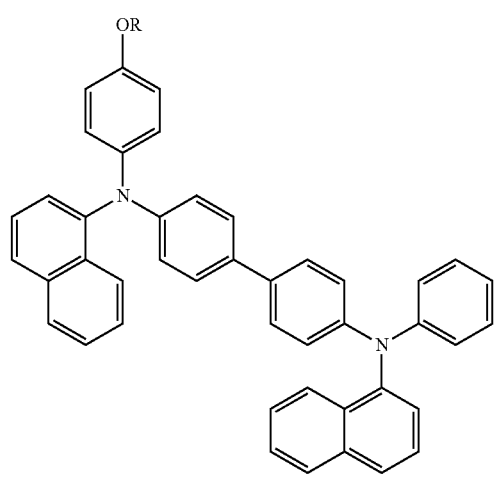
R: 
* ～～⟶ Compound 1e
* ～～～⟶ Compound 1f
* ～～～～⟶ Compound 1g
* indicates the bonding position to the oxygen atom.
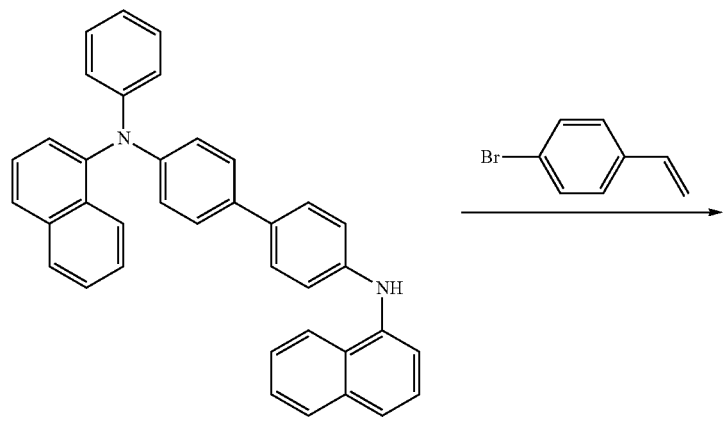
Compound 1b -continued
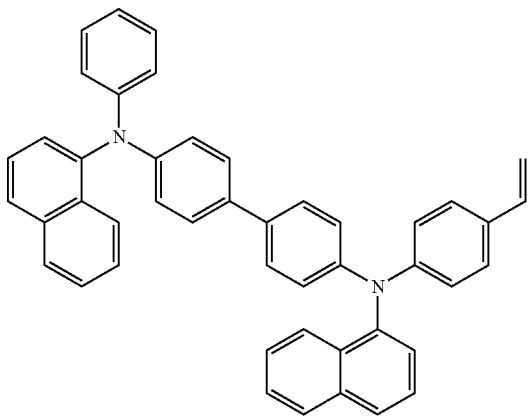
Compound 1h
[Chem. 21]
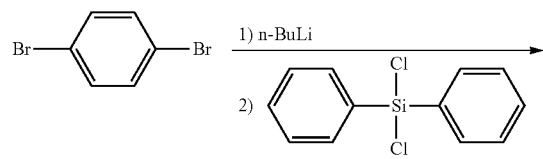
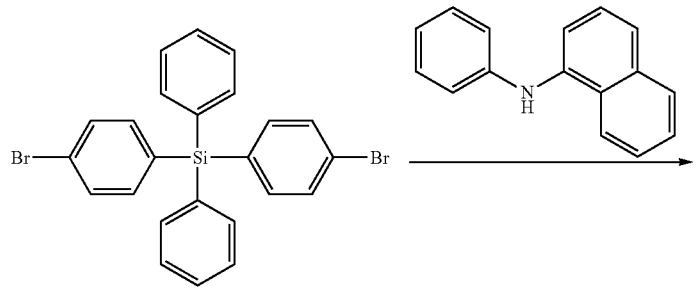
Compound 1i
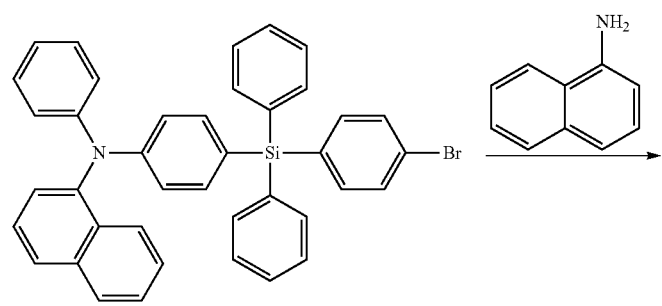
Compound 1j
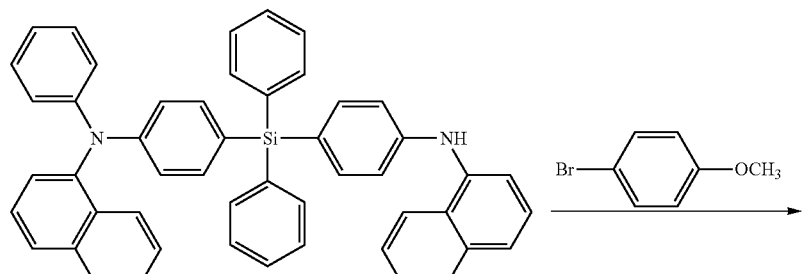
Compound 1k -continued
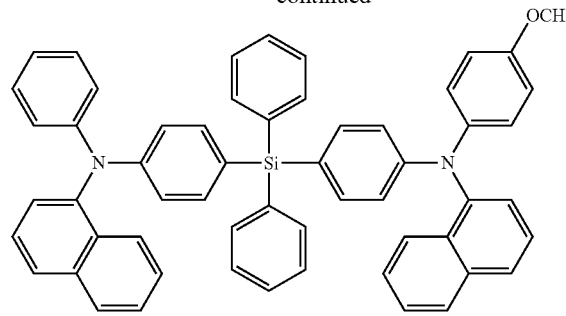
Compound 1l
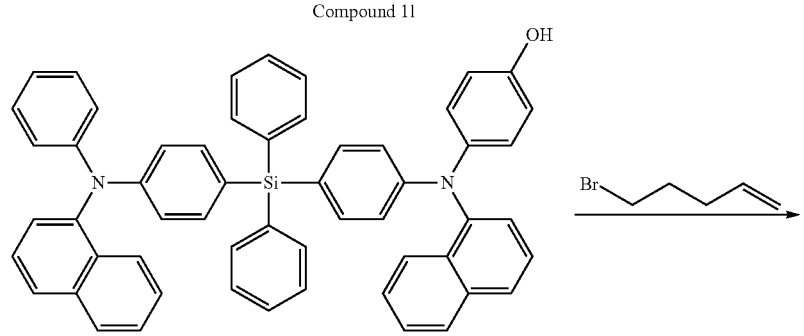
Compound 1m
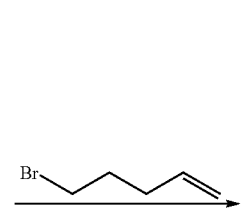
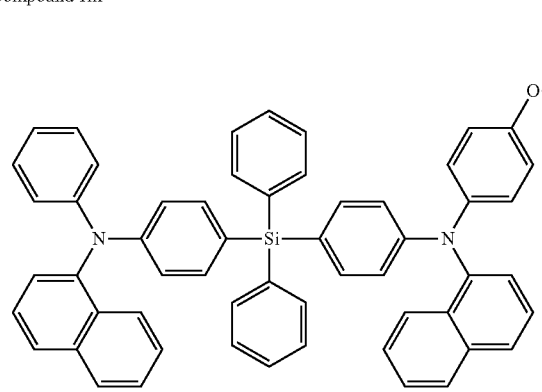
Compound 1n
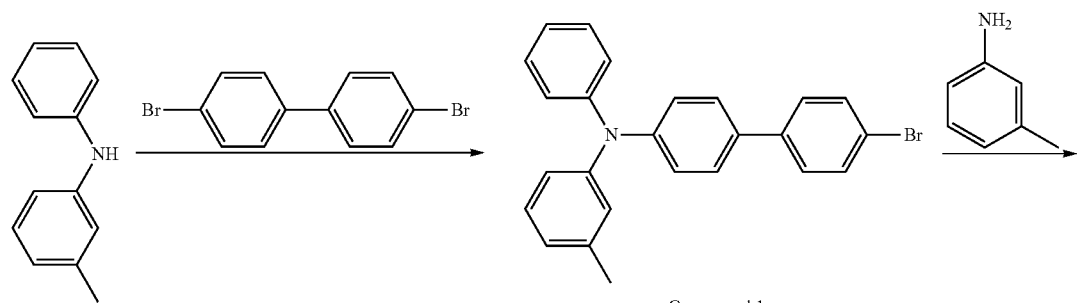
Compound 1o
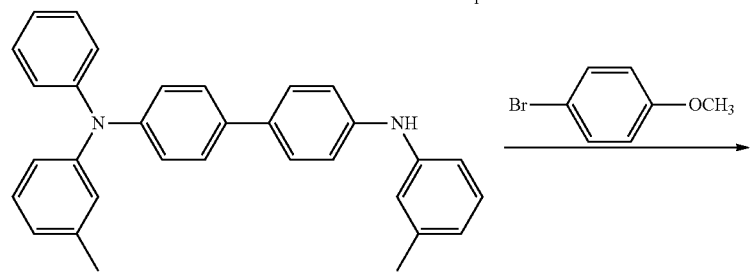
Compound 1p

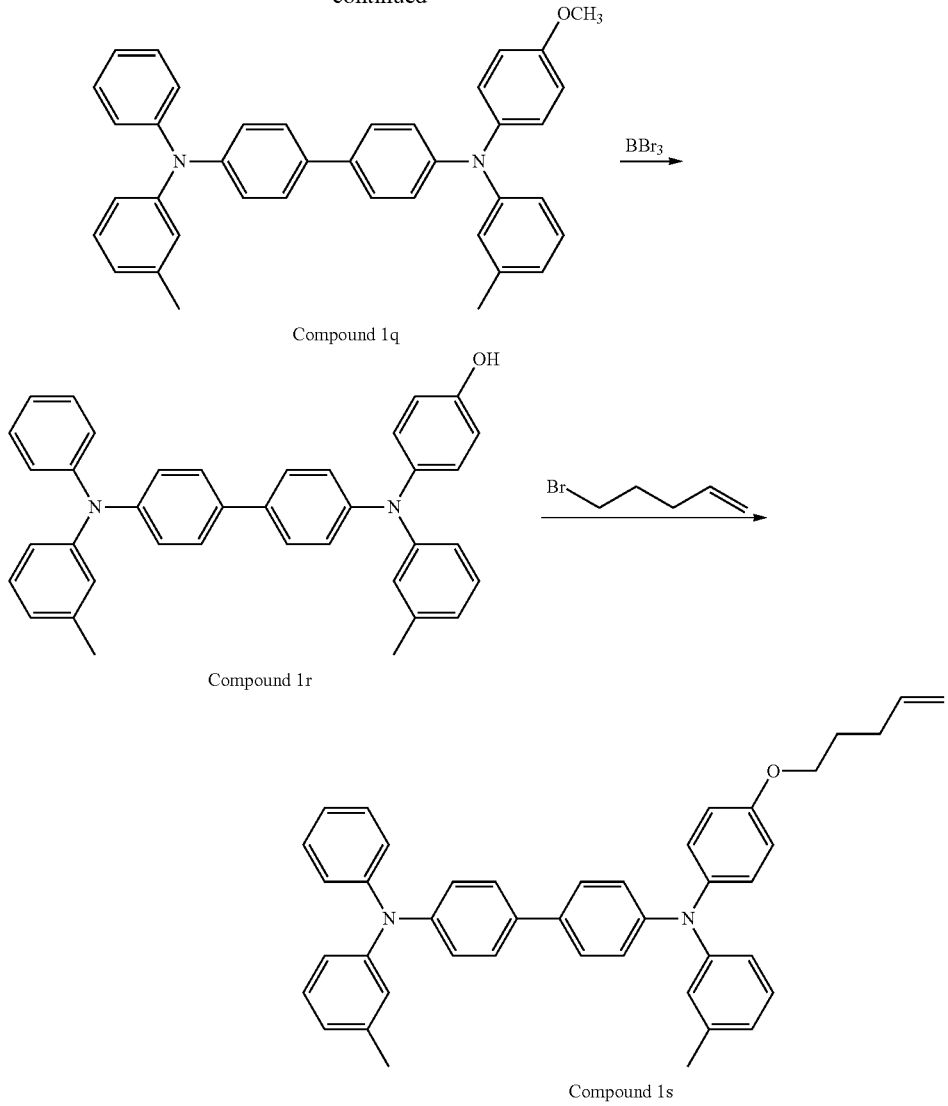

Compound 1q

Compound 1r

Compound 1s (Synthesis of Compound 1a)

Bis(dibenzylideneacetone)palladium (by Tokyo Chemical Industry) (4.2 g) and 1,1'-bis(diphenylphosphino)ferrocene (by Tokyo Chemical Industry) (4.4 g) were stirred in a toluene solution (1800 mL) in an inert atmosphere for 10 minutes, and then N-phenyl-1-naphtylamine (by Tokyo Chemical Industry) (80 g), 4,4'-dibromobiphenyl (by Wako Pure Chemical Industries) (204.8 g) and sodium tert-butoxide (by Tokyo Chemical Industry) (42.1 g) were added thereto. These were reacted in an inert atmosphere at 100° C. for 6 hours, and then water and ethyl acetate were added thereto. The organic layer was washed with saline water, and dried with magnesium sulfate, and then concentrated under reduced pressure. The concentrated residue was purified through silica gel column chromatography (developing solvent: ethyl acetate/hexane=1/30) to give the compound 1a (147.8 g).

(Synthesis of Compound 1b)

Bis(dibenzylideneacetone)palladium (4 g) and 1,1'-bis(diphenylphosphino)ferrocene (3.6 g) were stirred in a toluene solution (2800 mL) in an inert atmosphere for 10 minutes, and then the compound 1a (144 g), 1-naphthylamine (by Tokyo Chemical Industry) (122.4 g) and sodium tert-butoxide (39.2 g) were added thereto, These were reacted in an inert atmosphere at 100° C. for 6 hours, and then water and ethyl acetate were added thereto. The organic layer was washed with saline water, and dried with magnesium sulfate, and then concentrated under reduced pressure. The concentrated residue was purified through silica gel column chromatography (developing solvent: ethyl acetate/hexane=1/20) to give the compound 1b (122 g).

(Synthesis of Compound 1c)

To a THF (tetrahydrofuran) solution (140 mL) of bis(dibenzylideneacetone)palladium (1.34 g), 2-dicyclohexylphosphino-2'-dimethylaminobiphenyl (by Tokyo Chemical Industry) (1.02 g), the compound 1b (60 g) and 4-bromoanisole (by Tokyo Chemical Industry) (24 g), dropwise added was hexamethyldisilazane lithium (1.6 mol/L, THF solution) in an inert atmosphere at room temperature, then heated up to 65° C. and stirred for 2 hours. After the reaction, water and ethyl acetate were added to the system, and the organic layer was washed with saline water. The organic layer was dried with magnesium sulfate, and then concentrated under reduced pressure. The concentrated residue was purified through silica gel column chromatography (developing solvent: ethyl acetate/hexane=2/1) to give the compound 1c (24 g).

(Synthesis of Compound 1d)

With cooling with ice, 1 M boron tribromide in $CH_2Cl_2$ (by Aldrich) (34 mL) was dropwise added to a dichloromethane solution of the compound 1c (16 g). Subsequently, this was warmed up to room temperature and stirred for 1 hour. After the reaction, water and ethyl acetate were added to the system, and the organic layer was washed with saline water. The organic layer was dried with magnesium sulfate, and then concentrated under reduced pressure. The concentrated residue was purified through silica gel column chromatography (developing solvent: ethyl acetate/hexane=1/3) to give the compound 1d (15.2 g).

(Synthesis of Compound 1e)

The compound 1d (0.6 g), 5-bromo-1-pentene (by Tokyo Chemical Industry) (0.17 g) and potassium carbonate (0.54 g) were stirred in dimethylacetamide (6.5 mL) in an inert atmosphere for 12 hours. After the reaction, water and ethyl acetate were added to the system, and the organic layer was washed with saline water. The organic layer was dried with magnesium sulfate, and then concentrated under reduced pressure. The concentrated residue was recrystallized in a toluene solvent to give the compound 1e (0.53 g).

(Synthesis of Compound 1f)

The compound 1d (0.6 g), 7-bromo-1-heptene (by Aldrich) (0.2 g) and potassium carbonate (0.54 g) were stirred in dimethylacetamide (6.5 mL) in an inert atmosphere for 12 hours. After the reaction, water and ethyl acetate were added to the system, and the organic layer was washed with saline water. The organic layer was dried with magnesium sulfate, and then concentrated under reduced pressure. The concentrated residue was recrystallized in a toluene solvent to give the compound 1f (0.59 g).

(Synthesis of Compound 1g)

The compound 1d (0.6 g), 10-bromo-1-decene (by Aldrich) (0.25 g) and potassium carbonate (0.54 g) were stirred in dimethylacetamide (6.5 mL) in an inert atmosphere for 12 hours. After the reaction, water and ethyl acetate were added to the system, and the organic layer was washed with saline water. The organic layer was dried with magnesium sulfate, and then concentrated under reduced pressure. The concentrated residue was recrystallized in a toluene solvent to give the compound 1g (0.63 g).

(Synthesis of Compound 1h)

The compound 1b (3.2 g), 4-bromostyrene (by Tokyo Chemical Industry) (1.37 g), tris(dibenzylideneacetone)dipalladium (by Tokyo Chemical Industry) (0.11 g), 2,8,9-triisobutyl-2,5,8,9-tetraza-1-phosphabicyclo[3.3.3]undecene (by Aldrich) (86 mg) and sodium tertiary butoxide (by Tokyo Chemical Industry) (2.1 g) were stirred in dewatered toluene (50 mL) in an inert atmosphere for 12 hours. After the reaction, water and ethyl acetate were added to the system, and the organic layer was washed with saline water. The organic layer was dried with magnesium sulfate, and then concentrated under reduced pressure. The concentrated residue was recrystallized in a toluene solvent to give the compound 1h (3.15 g).

(Synthesis of Compound 1i)

In an inert atmosphere at 0° C., n-butyllithium (in hexane, 1.56 M) (by Wako Pure Chemical Industries) (204 mL) was dropwise added to a diethyl ether solution (1000 mL) of paradibromobenzene (by Tokyo Chemical Industry) (76 g). After this was stirred for 2 hours, a diethyl ether solution of dichlorodiphenylsilane (by Tokyo Chemical Industry) (40.4 g) was dropwise added thereto and stirred for 4 hours. After the reaction, the inorganic salt was removed, water and diethyl ether were added to the system, and the organic layer was washed with saline water. The organic layer was dried with magnesium sulfate, and then concentrated under reduced pressure. The concentrated residue was recrystallized in a toluene solvent to give the compound 1i (52.7 g).

(Synthesis of Compound 1j)

Bis(dibenzylideneacetone)palladium (by Tokyo Chemical Industry) (0.65 g) and 1,1'-bis(diphenylphosphino)ferrocene (by Tokyo Chemical Industry) (0.68 g) were stirred in a toluene solution (280 mL) in an inert atmosphere for 10 minutes, and then N-phenyl-1-naphtylamine (by Tokyo Chemical Industry) (12.3 g), the compound 1i (50 g) and sodium tert-butoxide (by Tokyo Chemical Industry) (6.48 g) were added thereto. These were reacted in an inert atmosphere at 100° C. for 6 hours, and then water and ethyl acetate were added thereto. The organic layer was washed with saline water, dried with magnesium sulfate, and then concentrated under reduced pressure. The concentrated residue was purified through silica gel column chromatography (developing solvent: ethyl acetate/hexane=1/30) to give the compound 1j (63.2 g).

(Synthesis of Compound 1k)

Bis(dibenzylideneacetone)palladium (1.2 g) and 1,1'-bis(diphenylphosphino)ferrocene (1.1 g) were stirred in a toluene solution (850 mL) in an inert atmosphere for 10 minutes, and then the compound 1j (60 g), 1-naphthylamine (by Tokyo Chemical Industry) (36.7 g) and sodium tert-butoxide (11.8 g) were added thereto. These were reacted in an inert atmosphere at 100° C. for 6 hours, and then water and ethyl acetate were added thereto. The organic layer was washed with saline water, dried with magnesium sulfate, and then concentrated under reduced pressure. The concentrated residue was purified through silica gel column chromatography (developing solvent: ethyl acetate/hexane=1/20) to give the compound 1k (49.5 g).

(Synthesis of Compound 1l)

To a THF solution (50 mL) of bis(dibenzylideneacetone) palladium (0.45 g) and 2-dicyclohexylphosphino-2'-dimethylaminobiphenyl (by Tokyo Chemical Industry) (0.35 g), the compound 1k (25 g) and 4-bromoanisole (by Tokyo Chemical Industry) (8.2 g), dropwise added was hexamethyldisilazane lithium (1.6 mol/L THF solution) in an inert atmosphere at room temperature, then heated up to 65° C., and stirred for 2 hours. After the reaction, water and ethyl acetate were added thereto, and the organic layer was washed with saline water. The organic layer was dried with magnesium sulfate, and then concentrated under reduced pressure. The concentrated residue was purified through silica gel column chromatography (developing solvent: ethyl acetate/hexane=2/1) to give the compound 1l (17.6 g).

(Synthesis of Compound 1m)

With cooling with ice, 1 M boron tribromide in $CH_2Cl_2$ (by Aldrich) (34 mL) was dropwise added to a dichloromethane solution of the compound 1l (16 g). Subsequently, this was warmed up to room temperature and stirred for 1 hour. After the reaction, water and ethyl acetate were added to the system, and the organic layer was washed with saline water. The organic layer was dried with magnesium sulfate, and then concentrated under reduced pressure. The concentrated residue was purified through silica gel column chromatography (developing solvent: ethyl acetate/hexane=1/3) to give the compound 1m (15.2 g).
(Synthesis of Compound 1n)

The compound 1m (5 g), 5-bromo-1-pentene (by Tokyo Chemical Industry) (1.1 g) and potassium carbonate (3.5 g) were stirred in dimethylacetamide (42 mL) in an inert atmosphere for 12 hours. After the reaction, water and ethyl acetate were added to the system, and the organic layer was washed with saline water. The organic layer was dried with magnesium sulfate, and then concentrated under reduced pressure. The concentrated residue was recrystallized in a toluene solvent to give the compound 1n (3.3 g).
(Synthesis of Compound 1s)

The compound 1s (13 g) was obtained from the compound 1o according to the same synthesis method as that for producing the compound 1e from the compound 1a according to the above-mentioned scheme.

Synthesis of Arylamine-Pendant Siloxane Polymer 1

Synthesis Example 1

A toluene solution of the compound 1e (0.5 g) and poly(methylhydrosiloxane) (molecular weight=2,100 to 2,400, MeHSiO mol %=100%, hereinafter the arylamine-pendant siloxane polymer produced from this polymer is referred to as a 35-mer) (43 mg) was stirred in a nitrogen atmosphere at 80° C. for 10 minutes. Dichloro(dicyclopentadiene)platinum (10 mg) was added to the reaction solution, and then stirred for 12 hours. The reaction solution was concentrated under reduced pressure, and the concentrated liquid was dropwise added to an IPA (isopropyl alcohol) solvent to give a precipitate. The precipitate was re-precipitated and purified from the toluene solution to an isopropyl alcohol/ethyl acetate=3/2 solvent repeatedly a few times to remove the excessive compound 1e. The molecular weight of the obtained arylamine-pendant siloxane polymer 1 was Mn=14,900 and Mw=23,800, and the structure thereof was identified through NMR. GPC and NMR of the arylamine-pendant siloxane polymer 1 confirmed that the amount of the unreacted Si—H in the polymer was 6 mol %. (The amount of the unreacted Si—H was computed according to the following computation expression.)

Proportion of Unreacted Si—H=(theoretical molecular weight in 100% reaction−molecular weight determined through GPC)/59 (molecular weight of MeSiO)/number of MeSiO units (35 in Synthesis Example 1)

Synthesis of Arylamine-Pendant Siloxane Polymer 2

Synthesis Example 2

According to the same method as in Synthesis Example 1, an arylamine-pendant siloxane polymer 2 (3.7 g) was produced from the compound 1e (5 g) and poly(methylhydrosiloxane) (molecular weight=700 to 800, MeHSiO mol %=100%, hereinafter the arylamine-pendant siloxane polymer produced from this polymer is referred to as a 10-mer) (51 mg). The molecular weight of the obtained arylamine-pendant siloxane polymer 2 was Mn=6,700 and Mw=7,300, and the structure thereof was identified through NMR. In GPC and NMR of the arylamine-pendant siloxane polymer 2, no unreacted Si—H was detected.

Synthesis of Arylamine-Pendant Siloxane Polymer 3

Synthesis Example 3

According to the same method as in Synthesis Example 1, an arylamine-pendant siloxane polymer 3 (0.27 g) was produced from the compound 1e (2.8 g) and poly(methylhydrosiloxane) (molecular weight=2,900 to 3,300, MeHSiO mol %=100%, hereinafter the arylamine-pendant siloxane polymer produced from this polymer is referred to as a 50-mer) (170 mg). The molecular weight of the obtained arylamine-pendant siloxane polymer 3 was Mn=18,900 and Mw=32,700, and the structure thereof was identified through NMR. GPC and NMR of the arylamine-pendant siloxane polymer 3 confirmed that the amount of the unreacted Si—H in the polymer was 10 mol %.

Synthesis of Arylamine-Pendant Siloxane Polymer 4

Synthesis Example 4

Comparative Example

According to the same method as in Synthesis Example 1, an arylamine-pendant siloxane polymer 4 (1.18 g) was produced from the compound 1h (2 g) and poly(methylhydrosiloxane) (35-mer) (190 mg). The molecular weight of the obtained arylamine-pendant siloxane polymer 4 was Mn=11,400 and Mw=16,900, and the structure thereof was identified through NMR. GPC and NMR of the arylamine-pendant siloxane polymer 4 confirmed that the amount of the unreacted Si—H in the polymer was 20 mol %.

Synthesis of Arylamine-Pendant Siloxane Polymer 5

Synthesis Example 5

According to the same method as in Synthesis Example 1, an arylamine-pendant siloxane polymer 5 (0.21 g) was produced from the compound 1f (0.4 g) and poly(methylhydrosiloxane) (35-mer) (33 mg). The molecular weight of the obtained arylamine-pendant siloxane polymer 5 was Mn=17,700 and Mw=24,700, and the structure thereof was identified through NMR. GPC and NMR of the arylamine-pendant siloxane polymer 5 confirmed that the amount of the unreacted Si—H in the polymer was 5 mol %.

Synthesis of Arylamine-Pendant Siloxane Polymer 6

Synthesis Example 6

According to the same method as in Synthesis Example 1, an arylamine-pendant siloxane polymer 6 (0.37 g) was produced from the compound 1g (0.5 g) and poly(methylhydrosiloxane) (35-mer) (37 mg). The molecular weight of the obtained arylamine-pendant siloxane polymer 6 was Mn=13,500 and Mw=25,300, and the structure thereof was identified through NMR. GPC and NMR of the arylamine-pendant siloxane polymer 6 confirmed that the amount of the unreacted Si—H in the polymer was 9 mol %.

Synthesis of Arylamine-Pendant Siloxane Polymer 7

Synthesis Example 7

According to the same method as in Synthesis Example 1, an arylamine-pendant siloxane polymer 9 (0.65 g) was produced from the compound 1n (1.5 g) and poly(methylhydrosiloxane) (35-mer) (102 mg). The molecular weight of the obtained arylamine-pendant siloxane polymer 9 was Mn=18,000 and Mw=30,100, and the structure thereof was identified through NMR. GPC and NMR of the arylamine-pendant siloxane polymer 7 confirmed that the amount of the unreacted Si—H in the polymer was 7 mol %.

Synthesis of Arylamine-Pendant Siloxane Polymer 8

Synthesis Example 8

According to the same method as in Synthesis Example 1, an arylamine-pendant siloxane polymer 10 (1.1 g) was produced from the compound is (2 g) and poly(methylhydrosiloxane) (35-mer) (194 mg). The molecular weight of the obtained arylamine-pendant siloxane polymer 10 was Mn=13,700 and Mw=21,900, and the structure thereof was identified through NMR. GPC and NMR of the arylamine-pendant siloxane polymer 10 confirmed that the amount of the unreacted Si—H in the polymer was 6 mol %.

Synthesis of Arylamine-Pendant Siloxane Polymer 9

Synthesis Example 9

According to the same method as in Synthesis Example 1, an arylamine-pendant siloxane polymer 11 (0.27 g) was produced from the compound 1e (0.35 g) and poly(ethylhydrosiloxane) (35-mer) (43 mg). The molecular weight of the obtained arylamine-pendant siloxane polymer 11 was Mn=15,800 and Mw=24,000, and the structure thereof was identified through NMR. GPC and NMR of the arylamine-pendant siloxane polymer 9 confirmed that the amount of the unreacted Si—H in the polymer was 20 mol %.

Synthesis of Arylamine-Pendant Methylsiloxane-Dimethylsiloxane Copolymer 10

Synthesis Example 10

According to the same method as in Synthesis Example 1, an arylamine-pendant methylsiloxane-dimethylsiloxane copolymer 10 (0.1 g) was produced from the compound 1e (0.5 g) and methylhydrosiloxane-dimethylsiloxane copolymer (15-mer: Azmax's HMS-501) (98 mg). The molecular weight of the obtained arylamine-pendant methylsiloxane-dimethylsiloxane copolymer 10 was Mn=2,800 and Mw=5,000, and the structure thereof was identified through NMR. GPC and NMR of the arylamine-pendant siloxane polymer 10 confirmed that the amount of the unreacted Si—H in the polymer was 9 mol %.

For comparison, a siloxane polymer 11 was produced with reference to JP-A-2000-80167.

[Chem. 22]

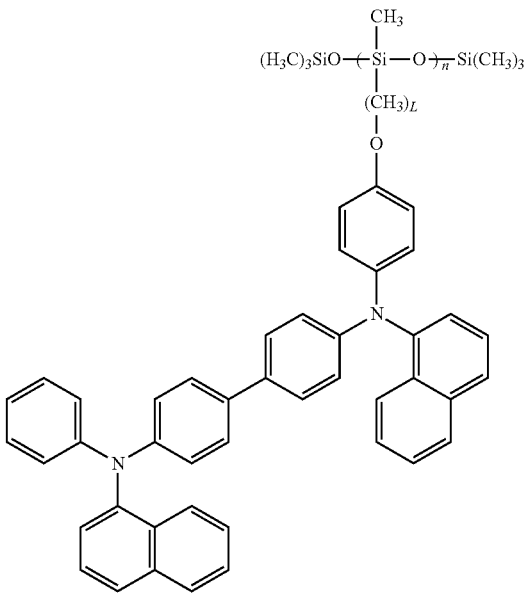

L = 5, n = 35; Siloxane Polymer 1
L = 5, n = 10; Siloxane Polymer 2
L = 5, n = 50; Siloxane Polymer 3
L = 7, n = 38; Siloxane Polymer 5
L = 10, n = 35; Siloxane Polymer 6

Siloxane Polymer 7

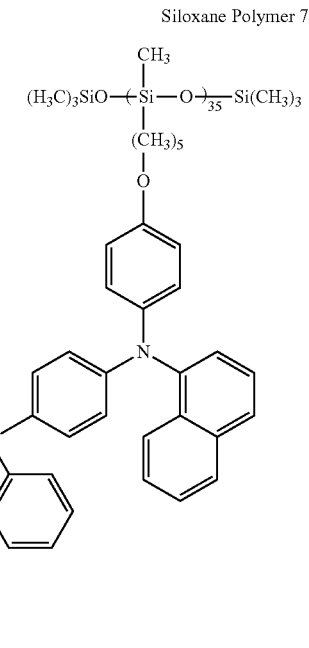

Siloxane Polymer 8
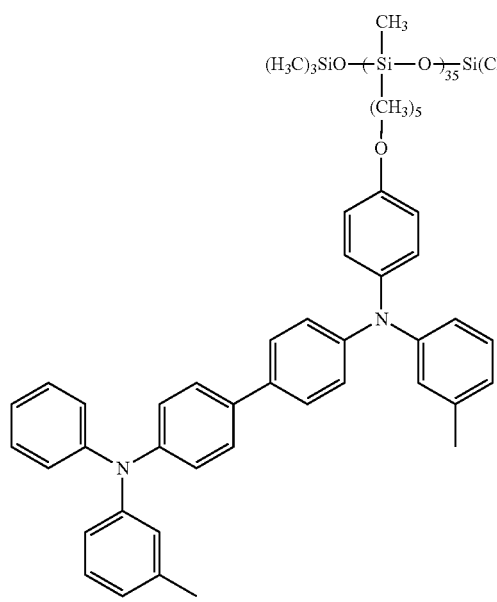
Siloxane Polymer 10
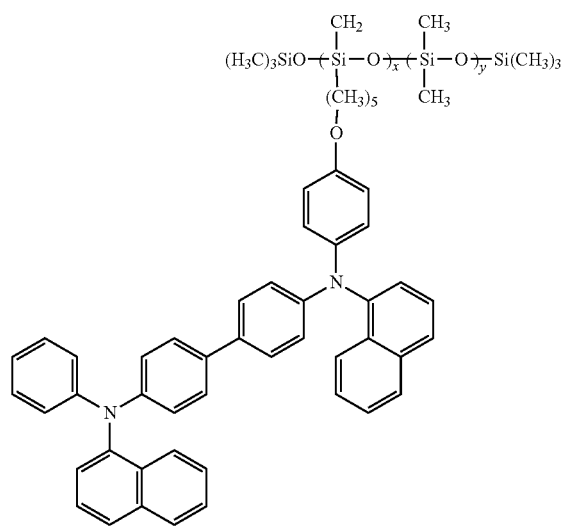
x + y = 15
Siloxane Polymer 9
Siloxane Polymer 11
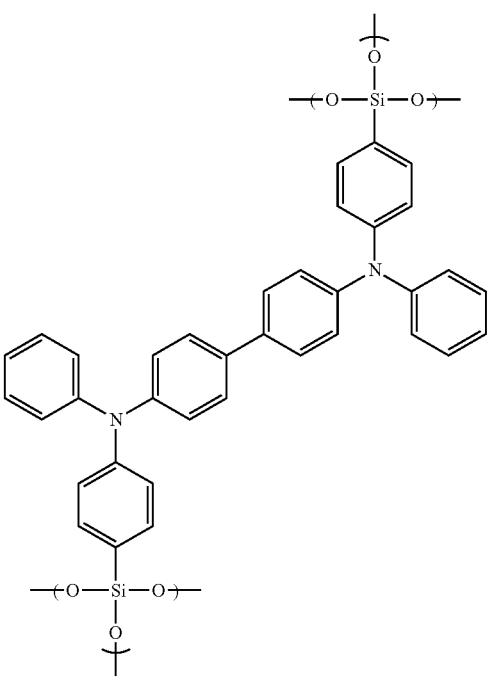

-continued

Siloxane Polymer 4

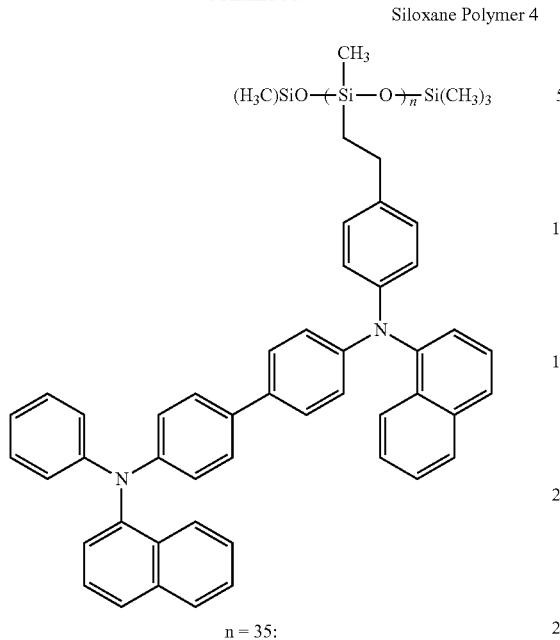

n = 35:

[Chem. 23]

Siloxane Polymer 4

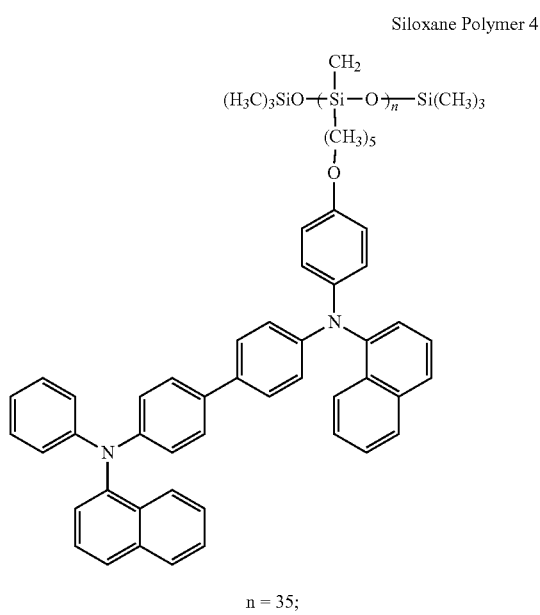

n = 35;

[Chem. 24]

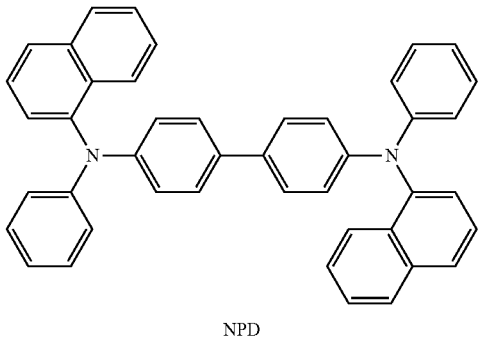

NPD

Example 2

Verification of Lamination Aptitude (Saturation Solubility)

The arylamine-pendant siloxane polymers 1 to 10 obtained in Synthesis Examples 1 to 10, the siloxane polymer 11 as Comparative Example and NPD powder were separately put in vials by the light of a yellow lamp, a predetermined amount of a solvent was added thereto and ultrasonicated for 1 hour. This was filtered through a filter of 0.2 μm, and the resulting solution was put into a quart cell, and the absorbance thereof was measured with a UV-visible spectrophotometer (Shimadzu's UV-2400). Three solutions each having a different concentration were prepared, and the absorbance thereof was measured. From the data, a calibration curve was drawn. A saturated solution having a higher concentration than those concentrations was prepared, and from the absorbance and the calibration curve thereof, the saturation solubility of each polymer was determined through computation.

TABLE 1

Solubility in Xylene

| | Material | Solvent | Solubility (% by mass) | Remarks |
|---|---|---|---|---|
| Synthesis Example 1 | siloxane polymer 1 | xylene | >10 | carbon number of linker = 5, 35-mer |
| Synthesis Example 2 | siloxane polymer 2 | xylene | >10 | carbon number of linker = 5, 10-mer |
| Synthesis Example 3 | siloxane polymer 3 | xylene | >10 | carbon number of linker = 5, 50-mer |
| Synthesis Example 4 (Comparative Example) | siloxane polymer 4 | xylene | 0.1 | carbon number of linker = 2, 35-mer |
| Synthesis Example 5 | siloxane polymer 5 | xylene | >10 | carbon number of linker = 7, 35-mer |

TABLE 1-continued

Solubility in Xylene

| Material | Solvent | Solubility (% by mass) | Remarks |
|---|---|---|---|
| Synthesis Example 6 | siloxane polymer 6 | xylene | >10 | carbon number of linker = 10, 35-mer |
| Synthesis Example 7 | siloxane polymer 7 | xylene | >10 | carbon number of linker = 5, 35-mer |
| Synthesis Example 8 | siloxane polymer 8 | xylene | >10 | carbon number of linker = 5, 35-mer |
| Synthesis Example 9 | siloxane polymer 9 | xylene | >10 | carbon number of linker = 5, 35-mer |
| Synthesis Example 10 | siloxane polymer 10 | xylene | >10 | carbon number of linker = 5, 7.5-mer |
| Comparative Example 1 | siloxane polymer 11 | xylene | 3 | JP-A-2000-80167 |
| Comparative Example 2 | NPD | xylene | 0.14 | low-molecular arylamine |

TABLE 2

Solubility in Cyclohexanone

| Material | Solvent | Solubility (% by mass) | Remarks |
|---|---|---|---|
| Synthesis Example 1 | siloxane polymer 1 | cyclohexanone | <0.01 | carbon number of linker = 5, 35-mer |
| Synthesis Example 2 | siloxane polymer 2 | cyclohexanone | 0.1 | carbon number of linker = 5, 10-mer |
| Synthesis Example 3 | siloxane polymer 3 | cyclohexanone | <0.01 | carbon number of linker = 5, 50-mer |
| Synthesis Example 4 (Comparative Example) | siloxane polymer 4 | cyclohexanone | <0.01 | carbon number of linker = 2, 35-mer |
| Synthesis Example 5 | siloxane polymer 5 | cyclohexanone | <0.01 | carbon number of linker = 7, 35-mer |
| Synthesis Example 6 | siloxane polymer 6 | cyclohexanone | <0.1 | carbon number of linker = 10, 35-mer |
| Synthesis Example 7 | siloxane polymer 7 | cyclohexanone | <0.01 | carbon number of linker = 5, 35-mer |
| Synthesis Example 8 | siloxane polymer 8 | cyclohexanone | <0.1 | carbon number of linker = 5, 35-mer |
| Synthesis Example 9 | siloxane polymer 9 | cyclohexanone | <0.1 | carbon number of linker = 5, 35-mer |
| Synthesis Example 10 | siloxane polymer 10 | cyclohexanone | <1.0 | carbon number of linker = 5, 7.5-mer |
| Comparative Example 1 | siloxane polymer 11 | cyclohexanone | <0.01 | JP-A-2000-80167 |
| Comparative Example 2 | NPD | cyclohexanone | >10 | low-molecular arylamine |

As known from the above results, using the arylamine-pendant siloxane polymer of Examples of the invention provides a difference in solubility in solvent of at least $10^3$ between two types of solvents, for example, as in Tables.

Example 3

Verification of Coating Properties (Film Formability)

The saturated solution prepared in Example 2 was dropwise applied to a glass substrate and dried under pressure at 120° C. for 2 hours. After dried, the condition of the film was visually checked to thereby verify the film formability of the solution.

TABLE 3

| Material | Film Formability | Condition of Film | Remarks |
|---|---|---|---|
| Synthesis Example 1 | siloxane polymer 1 | A | amorphous film | carbon number of linker = 5, 35-mer |

TABLE 3-continued

| | Material | Film Formability | Condition of Film | Remarks |
|---|---|---|---|---|
| Synthesis Example 2 | siloxane polymer 2 | A | amorphous film | carbon number of linker = 5, 10-mer |
| Synthesis Example 3 | siloxane polymer 3 | A | amorphous film | carbon number of linker = 5, 50-mer |
| Synthesis Example 4 (Comparative Example) | siloxane polymer 4 | B | amorphous film | carbon number of linker = 2, 35-mer |
| Synthesis Example 5 | siloxane polymer 5 | A | amorphous film | carbon number of linker = 7, 35-mer |
| Synthesis Example 6 | siloxane polymer 6 | A | amorphous film | carbon number of linker = 10, 35-mer |
| Synthesis Example 7 | siloxane polymer 7 | A | amorphous film | carbon number of linker = 5, 35-mer |
| Synthesis Example 8 | siloxane polymer 8 | A | amorphous film | carbon number of linker = 5, 35-mer |
| Synthesis Example 9 | siloxane polymer 9 | A | amorphous film | carbon number of linker = 5, 35-mer |
| Synthesis Example 10 | siloxane polymer 10 | A | amorphous film | carbon number of linker = 5, 7.5-mer |
| Comparative Example 1 | siloxane polymer 11 | C | partly whitened | JP-A-2000-80167 |
| Comparative Example 2 | NPD | C | whitened | low-molecular arylamine |

A: Amorphous film with no defect
B: One or two of 10 films partly whitened.
C: Completely whitened.

In Table 3, the "amorphous film" was a transparent film.

As known from the above results, the film formability of the siloxane polymer synthesized via a linker in the invention is better than that of the low-molecular arylamine or the siloxane polymer not having a linker or having a linker with at most 2 carbon atoms.

Example 4

Evaluation of Coating-Type Organic EL Device (Process of Device Production)
(Preparation of Coating Liquid 1)

The siloxane polymer (0.4% by mass) was mixed with xylene for electronics (by Kanto Chemical) (99.6% by mass) to prepare a coating liquid for organic electroluminescence devices (coating liquid 1).

(Preparation of Coating Liquids 2 to 12)

Coating liquids 2 to 12 were prepared in the same manner as that for the coating liquid 1 except that the corresponding siloxane polymer 2 to 11 or α-NPD was used.

(Production of Organic EL Device A)

An ITO film having a thickness of 150 mm was formed on a glass substrate of 25 mm×25 mm×0.7 mm according to vapor deposition thereon to give a transparent supporting substrate. The transparent supporting substrate was put into a wash chamber, and ultrasonically washed therein with 2-propanol, and then UV-ozonated for 30 minutes.

A solution prepared by dissolving PTPDES-2 (by Chemipro Kasei) (0.4% by mass) in cyclohexanone for electronics (by Kanto Chemical) (99.6% by mass) was applied onto the ITO glass substrate by spin coating, then dried at 120° C. for 30 minutes and annealed at 160° C. for 10 minutes to thereby form a film of a hole injection layer (film thickness, about 40 nm).

In a globe box (having a dew point of −68° C. and an oxygen concentration of 10 ppm), the coating liquid 1 was applied onto this by spin coating to thereby form a hole transport layer (film thickness, about 10 nm).

Further, Ir(ppy)$_3$ as a light emitting material and CBP as a host material in a ratio by mass of 5/95 were applied onto the above according to co-evaporation to form a light emitting layer (film thickness, about 30 nm).

Next, a film of BAlq having a thickness of 40 nm was formed thereon according to a vapor deposition method to be an electron transport layer (film thickness, about 40 nm).

Lithium fluoride was vapor-deposited thereon in a thickness of 1 nm, and further, metal aluminium was vapor-deposited thereon in 100 nm, thereby forming a cathode.

Thus produced, the laminate was put in a globe box purged with argon gas, and sealed up with a stainless sealing can and a UV-curable adhesive (XNR5516HV, by Nagase-CIBA).

In the manner as above, an organic EL device A was produced.

(Production of Organic EL Devices B to N)

Organic EL devices B to N were produced in the same manner as that for the organic EL device A except that the coating liquids 2 to 12 were used in forming the hole transport layer.

(Device Driving Voltage and Evaluation of Device Durability)

At an initial light emission brightness of 1000 cd/m$^2$ and at room temperature, a constant current was applied to the produced device, whereupon the voltage of the device was measured; and after the device was thus driven continuously, the time taken until the light emission brightness lowered to ½ was reckoned. The results are shown in Table 4.

TABLE 4

| | | Voltage* | Brightness Half-Value Period* | Remarks |
|---|---|---|---|---|
| Organic EL Device A | the invention (siloxane polymer 1) | 1 | 1 | carbon number of linker = 5, 35-mer |
| Organic EL Device B | the invention (siloxane polymer 2) | 1.26 | 0.78 | carbon number of linker = 5, 10-mer |
| Organic EL Device C | the invention (siloxane polymer 3) | 0.99 | 1.02 | carbon number of linker = 5, 50-mer |
| Organic EL Device D | the invention (siloxane polymer 4) | 1.79 | 0.52 | carbon number of linker = 2, 35-mer |
| Organic EL Device E | the invention (siloxane polymer 5) | 1.16 | 0.96 | carbon number of linker = 7, 35-mer |
| Organic EL Device F | the invention (siloxane polymer 6) | 1.31 | 0.85 | carbon number of linker = 10, 35-mer |
| Organic EL Device G | the invention (siloxane polymer 7) | 1.13 | 0.95 | carbon number of linker = 5, 35-mer |
| Organic EL Device H | the invention (siloxane polymer 8) | 1.29 | 0.72 | carbon number of linker = 5, 35-mer |
| Organic EL Device I | the invention (siloxane polymer 9) | 1.11 | 0.99 | carbon number of linker = 5, 35-mer |
| Organic EL Device J | the invention (siloxane polymer 10) | 1.34 | 0.69 | carbon number of linker = 5, 7.5-mer |
| Organic EL Device M | comparative example (siloxane polymer 11) | 2.21 | 0.36 | JP-A-2000-80167 |
| Organic EL Device N | comparative example (coated with NPD) | 1.96 | 0.48 | low-molecular arylamine |

*Standardized based on the organic EL device A of the invention, 1.

As known from the above results, the performance of the devices using the siloxane polymer in the invention is much better than that of the devices of comparative examples in point of the voltage and the brightness half-value period. In addition, in the devices of the invention, those in which the linker has a carbon number of 5 had the best performance. This may be considered because the arylamine moieties could be stacked more via the linker and the charge mobility could be thereby increased. In cases where the carbon number of the linker is 10, the proportion of the electrically-insulating linker moieties would increase so that the charge mobility of the devices would lower than those of the devices where the carbon number of the linker is 5.

[Chem. 25]

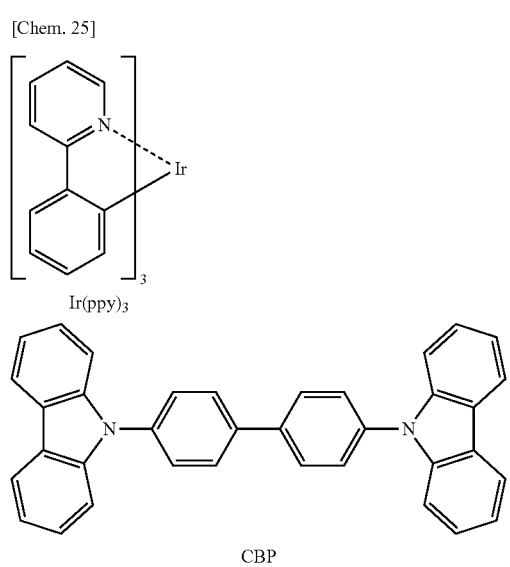

Ir(ppy)₃

CBP

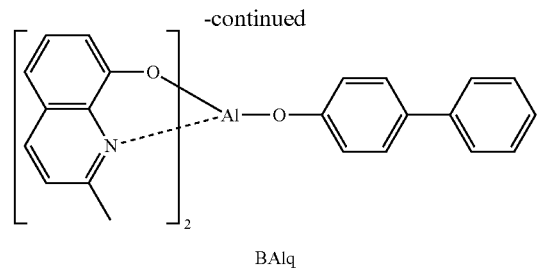

BAlq

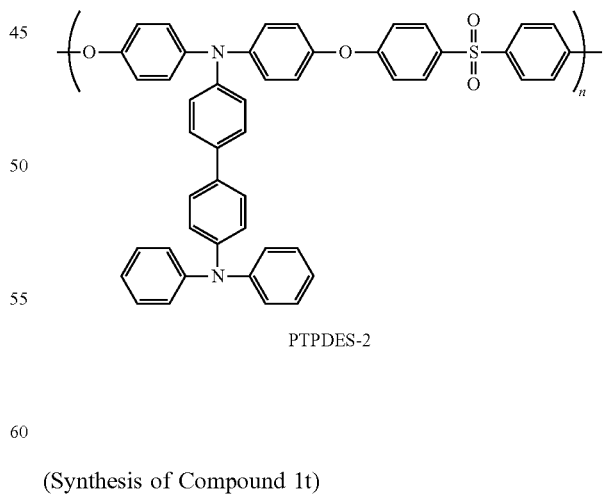

PTPDES-2

(Synthesis of Compound 1t)

A compound 1t was synthesized according to the same method as that for the compound 1e, except that N-phenyl- 2-naphthylamine was used as the secondary amine material in the first step and 2-naphthylamine was used as the primary amine material in the second step in the above-mentioned synthesis scheme.

Synthesis Example 11

A toluene solution of the compound 1t (0.5 g) and poly(methylhydrosiloxane) (molecular weight=2,100 to 2,400, MeHSiO mol %=100%, hereinafter the arylamine-pendant siloxane polymer produced from this polymer is referred to as a 35-mer) (43 mg) was stirred in a nitrogen atmosphere at 80° C. for 10 minutes. Dichloro(dicyclopentadiene)platinum (10 mg) was added to the reaction solution, and then stirred for 12 hours. The reaction solution was concentrated under reduced pressure, and the concentrated liquid was dropwise added to an IPA (isopropyl alcohol) solvent to give a precipitate. The precipitate was re-precipitated and purified from the toluene solution to an isopropyl alcohol/ethyl acetate=3/2 solvent repeatedly a few times to remove the excessive compound 1t. The molecular weight of the obtained arylamine-pendant siloxane polymer 12 was Mn=14,900 and Mw=23,800, and the structure thereof was identified through NMR. GPC and NMR of the arylamine-pendant siloxane polymer 12 confirmed that the amount of the unreacted Si—H in the polymer was 6 mol %.

[Chem. 26]

Compound 1t

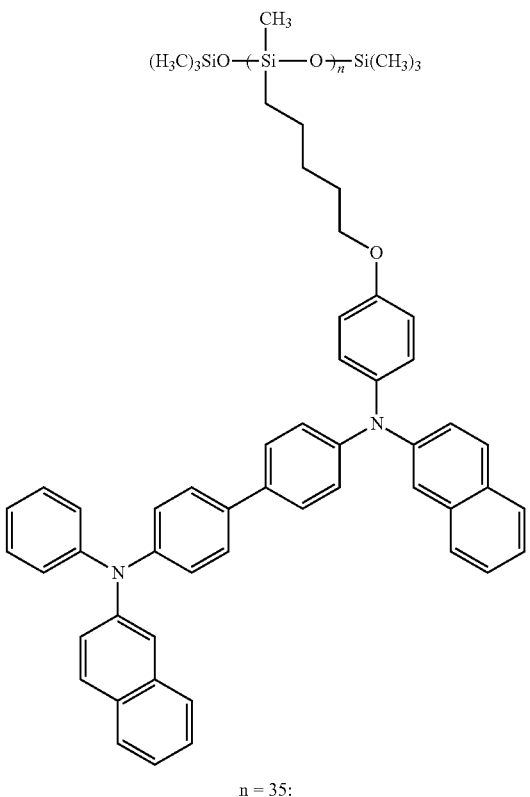

Siloxane Polymer 12 n = 35:

The siloxane polymer 12 was evaluated in the same manner as that for the above-mentioned siloxane polymers 1 to 10 (lamination aptitude, coating properties (film formability), coating-type EL device evaluation).

In verification of the lamination aptitude, the solubility of the polymer in xylene was ">10% by mass", and the solubility thereof in cyclohexanone was "<0.01% by mass".

In verification of the coating properties (film formability), the film formability of the polymer was "A", and the film condition was "amorphous film".

In evaluation of the coating-type EL device, the voltage was "1.05" and the brightness half-value period was "0.98", as standardized based on the organic EL device A, 1.

Synthesis Example 12

A toluene solution of the compound 1e (0.5 g) and poly(methylhydrosiloxane) (molecular weight=2,100 to 2,400, MeHSiO mol %=100%, hereinafter the arylamine-pendant siloxane polymer produced from this polymer is referred to as a 35-mer) (53 mg) was stirred in a nitrogen atmosphere at 80° C. for 10 minutes. Dichloro(dicyclopentadiene)platinum (10 mg) was added to the reaction solution, and then stirred for 12 hours. The reaction solution was concentrated under reduced pressure, and the concentrated liquid was dropwise added to an IPA (isopropyl alcohol) solvent to give a precipitate. The precipitate was re-precipitated and purified from the toluene solution to an isopropyl alcohol/ethyl acetate=3/2 solvent repeatedly a few times to remove the excessive compound 1e. The molecular weight of the obtained arylamine-pendant siloxane polymer 13 was Mn=14,000 and Mw=22,500, and the structure thereof was identified through NMR. GPC and NMR of the arylamine-pendant siloxane polymer 13 confirmed that the amount of the unreacted Si—H in the polymer was 11 mol %.

The siloxane polymer 13 was evaluated in the same manner as that for the above-mentioned siloxane polymers 1 to 10 (lamination aptitude, coating properties (film formability), coating-type EL device evaluation).

In verification of the lamination aptitude, the solubility of the polymer in xylene was ">10% by mass", and the solubility thereof in cyclohexanone was "<0.01% by mass".

In verification of the coating properties (film formability), the film formability of the polymer was "A", and the film condition was "amorphous film".

In evaluation of the coating-type EL device, the voltage was "1.15" and the brightness half-value period was "0.78", as standardized based on the organic EL device A, 1.

Synthesis Example 13

A toluene solution of the compound 1e (0.5 g) and poly(methylhydrosiloxane) (molecular weight=600 to 700, MeHSiO mol %=100%, hereinafter the arylamine-pendant siloxane polymer produced from this polymer is referred to as a 9-mer) (52 mg) was stirred in a nitrogen atmosphere at 80° C. for 10 minutes. Dichloro(dicyclopentadiene)platinum (10 mg) was added to the reaction solution, and then stirred for 12 hours. The reaction solution was concentrated under reduced pressure, and the concentrated liquid was dropwise added to an IPA (isopropyl alcohol) solvent to give a precipitate. The precipitate was re-precipitated and purified from the toluene solution to an isopropyl alcohol/ethyl acetate=3/2 solvent repeatedly a few times to remove the excessive compound 1e. The molecular weight of the obtained arylamine-pendant siloxane polymer 14 was Mn=6,000 and Mw=6,600, and the structure thereof was identified through NMR. In GPC and NMR of the arylamine-pendant siloxane polymer 14, no unreacted Si—H was detected.

The siloxane polymer 14 was evaluated in the same manner as that for the above-mentioned siloxane polymers 1 to 10 (lamination aptitude, coating properties (film formability), coating-type EL device evaluation).

In verification of the lamination aptitude, the solubility of the polymer in xylene was ">10% by mass", and the solubility thereof in cyclohexanone was "<0.1% by mass".

In verification of the coating properties (film formability), the film formability of the polymer was "B", and the film condition was "amorphous film".

In evaluation of the coating-type EL device, the voltage was "1.65" and the brightness half-value period was "0.68", as standardized based on the organic EL device A, 1.

Synthesis Example 14

A toluene solution of the compound 1e (0.5 g) and poly(methylhydrosiloxane) (molecular weight=3,500 to 4,000, MeHSiO mol %=100%, hereinafter the arylamine-pendant siloxane polymer produced from this polymer is referred to as a 55-mer) (47 mg) was stirred in a nitrogen atmosphere at 80° C. for 10 minutes. Dichloro(dicyclopentadiene)platinum (10 mg) was added to the reaction solution, and then stirred for 12 hours. The reaction solution was concentrated under reduced pressure, and the concentrated liquid was dropwise added to an IPA (isopropyl alcohol) solvent to give a precipitate. The precipitate was re-precipitated and purified from the toluene solution to an isopropyl alcohol/ethyl acetate=3/2 solvent repeatedly a few times to remove the excessive compound 1e. The molecular weight of the obtained arylamine-pendant siloxane polymer 15 was Mn=24,300 and Mw=39,000, and the structure thereof was identified through NMR. GPC and NMR of the arylamine-pendant siloxane polymer 15 confirmed that the amount of the unreacted Si—H in the polymer was 2 mol %.

The siloxane polymer 15 was evaluated in the same manner as that for the above-mentioned siloxane polymers 1 to 10 (lamination aptitude, coating properties (film formability), coating-type EL device evaluation).

In verification of the lamination aptitude, the solubility of the polymer in xylene was ">10% by mass", and the solubility thereof in cyclohexanone was "<0.01% by mass".

In verification of the coating properties (film formability), the film formability of the polymer was "A", and the film condition was "amorphous film".

In evaluation of the coating-type EL device, the voltage was "1.95" and the brightness half-value period was "0.62", as standardized based on the organic EL device A, 1.

INDUSTRIAL APPLICABILITY

According to the invention, there is provided an organic electroluminescence device material, which, in its production, is free from formation of impurities that worsen the performance of organic EL devices, which, in forming an upper layer by coating, does not cause dissolution mixing or swelling mixing, which forms a film of good quality and which contributes toward improving the performance (high luminous efficiency, and low driving voltage) of organic EL devices.

According to the invention, there is also provided a film which is excellent in quality not causing dissolution mixing or swelling mixing in forming an upper layer by coating, and which contributes toward improving the performance of organic EL devices.

Further according to the invention, there is provided an organic electroluminescence device which is excellent in productivity and luminous efficiency and takes a low driving voltage.

While the present invention has been described in detail and with reference to specific embodiments thereof, it will be apparent to one skilled in the art that various changes and modifications can be made therein without departing from the spirit and scope thereof.

This application is based on Japanese Patent Application (No. 2010-150594) filed Jun. 30, 2010, the contents of which are herein incorporated by reference.

REFERENCE SIGNS LIST

2 Substrate
3 Anode

4 Hole Injection Layer
5 Hole Transport Layer
6 Light Emitting Layer
7 Hole Blocking Layer
8 Electron Transport Layer
9 Cathode
10 Organic Electroluminescence Device

The invention claimed is:

1. A material for an organic electroluminescence device comprising an acyclic siloxane compound that is end-capped with a trialkysilanol and the remainder of the acyclic siloxane compound consisting of a repeating unit represented by formula (1), a repeating unit represented by —(SiR$^{11}$R$^{12}$O)—, and a repeating unit containing Si H:

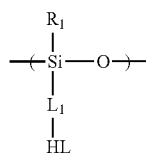

(1)

wherein R$_1$ represents an alkyl group or an aryl group,

L$_1$ represents a divalent linking group having 3 or more carbon atoms,

HL represents a group including two or more of a triarylamine unit, the content of the —(SiR$^{11}$R$^{12}$O)— unit is at most 80 mol % relative to the total content of the structural unit represented by formula (1), R$^{11}$ and R$^{12}$ each independently represent an alkyl group, and the content of the unit containing Si—H is at most 20 mol % relative to the total of the recurring units represented by formula (1);

wherein at least one of the following conditions is true:

(a) R$^{11}$ and R$^{12}$ each independently represent an unsubstituted alkyl group; or (b) Li represents a divalent linking group having 3 or more carbon atoms and at least one atom selected from the group consisting of an oxygen atom, a sulfur atom, and a nitrogen atom.

2. The material for an organic electroluminescence device according to claim 1, wherein the HL in the formula (1) is represented by formula (2):

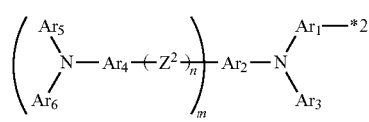

(2)

wherein each of Ar$_1$, Ar$_2$ and Ar$_4$ independently represents an arylene group, each of Ar$_3$, Ar$_5$ and Ar$_6$ independently represents an aryl group, Z$^2$ represents a divalent linking group, Ar$_4$, Ar$_5$, Ar$_6$ and Z$^2$ may be the same or different from each other if each of Ar$_4$, Ar$_5$, Ar$_6$ and Z$^2$ is plurally present, n represents a number of Z$^2$ in each of triarylamine units and n is 0 or 1, m represents a repeating number of the triarylamine unit and m is an integer of 1 or more, when m is 2 or more, in the each of the triarylamine units Ar$_5$ in one of the triarylamine units is bound to Z$^2$ in the other triarylamine unit, when n is 0 and m is 1, Ar$_2$ and Ar$_4$ are bound to each other via a single bond, when n is 0 and m is 2 or more, Ar$_2$ and Ar$_4$ are bound to each other via a single bond and, in the each of triarylamine units, Ar$_4$ in one of the triarylamine units is bound to Ar$_5$ in the other triarylamine unit, and

*2 represents a site to be bound to L$_1$ in the formula (1).

3. The material for an organic electroluminescence device according to claim 1, wherein L$_1$ in the formula (1) is represented by formula (3):

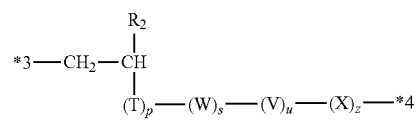

(3)

wherein R$_2$ represents a hydrogen atom or an alkyl group,

T represents a divalent linking group,

W represents an oxygen atom, —NH— or a sulfur atom,

V represents a divalent linking group,

X represents —CH$_2$—, an oxygen atom or —NH—, p represents an integer of 1 to 5, s represents 0 or 1, u represents an integer of 0 to 5, z represents 0 or 1, T and V may be the same or different from each other if each of T and V is plurally present, provided that any one of T, V and X includes at least one carbon atom,

*3 represents a site to be bound to a silicon atom in the formula (1), and

*4 represents a site to be bound to HL in the formula (1).

4. The material for an organic electroluminescence device according to claim 1, wherein, in the siloxane compound, a ratio of a repeating unit including Si—H to a total of the repeating unit represented by the formula (1) is 0 to 10%.

5. The material for an organic electroluminescence device according to claim 1, wherein the siloxane compound is a 10- to 50-mer of the repeating unit represented by the formula (1).

6. The material for an organic electroluminescence device according to claim 2, wherein the formula (2) is represented by formula (5):

(5)

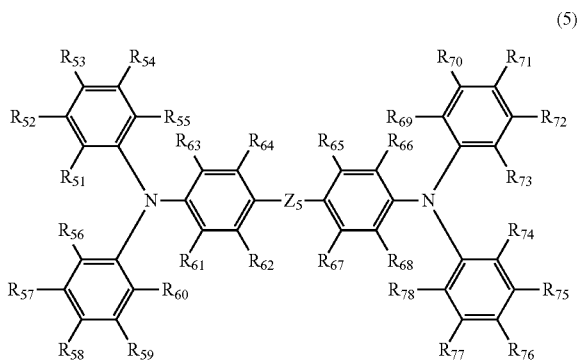

wherein each of $R_{51}$ to $R_{78}$ independently represents a hydrogen atom, an alkyl group, a cycloalkyl group, an alkoxy group or a silyl group, provided that any one of $R_{51}$ to $R_{55}$ is bound to $L_1$ in the formula (1), and $Z_5$ represents a single bond or a divalent linking group.

7. The material for an organic electroluminescence device according to claim 2, wherein the formula (2) is represented by formula (6):

(6)

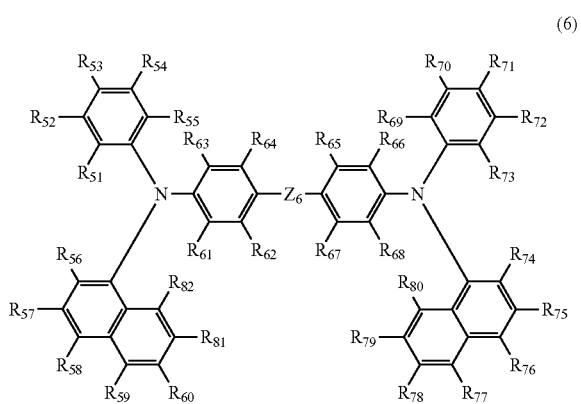

wherein each of $R_{51}$ to $R_{82}$ independently represents a hydrogen atom, an alkyl group, a cycloalkyl group, an alkoxy group or a silyl group, provided that any one of $R_{51}$ to $R_{55}$ is bound to $L_1$ in the formula (1), and $Z_6$ represents a single bond or a divalent linking group.

8. The material for an organic electroluminescence device according to claim 2, wherein the formula (2) is represented by formula (7):

(7)

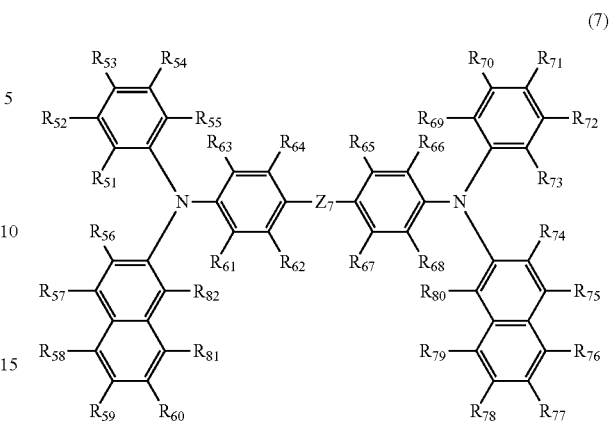

wherein each of $R_{51}$ to $R_{82}$ independently represents a hydrogen atom, an alkyl group, a cycloalkyl group, an alkoxy group or a silyl group, provided that any one of $R_{51}$ to $R_{55}$ is bound to $L_1$ in the formula (1), and $Z_7$ represents a single bond or a divalent linking group.

9. An organic electroluminescence device comprising, on a substrate:
   a pair of electrodes including an anode and a cathode;
   a plurality of organic layers between the electrodes, wherein at least one of the plurality of organic layers is a light emitting layer and at least one of the plurality of organic layers is between the anode and the light emitting layer and
   contains the material for an organic electroluminescence device according to claim 1.

10. The organic electroluminescence device according to claim 9,
    wherein the material for an organic electroluminescence device is contained in a hole injection layer.

11. The organic electroluminescence device according to claim 9,
    wherein the material for an organic electroluminescence device is contained in a hole transport layer.

12. A method for manufacturing the organic electroluminescence device according to claim 9,
    wherein the layer including the material for an organic electroluminescence device is formed by a wet process.

13. A film comprising the material for an organic electroluminescence device according to claim 1.

* * * * *

UNITED STATES PATENT AND TRADEMARK OFFICE
CERTIFICATE OF CORRECTION

PATENT NO. : 10,840,461 B2
APPLICATION NO. : 13/805154
DATED : November 17, 2020
INVENTOR(S) : Yasunori Yonekuta, Koji Takaku and Naoyuki Hayashi It is certified that error appears in the above-identified patent and that said Letters Patent is hereby corrected as shown below:

In the Claims

Please amend Claim 1 at Column 69 Lines 11-17 as follows:
-- 1. A material for an organic electroluminescence device comprising an acyclic siloxane compound that is end-capped with a trialkylsilanol and the remainder of the acyclic siloxane consisting of a repeating unit represented by formula (1), a repeating unit represented by ($SiR^{11}R^{12}O$), and a repeating unit containing Si—H: --

Please amend Claim 1 at Column 69 Lines 46-50 as follows:
-- (b) $L_1$ represents a divalent linking group having 3 or more carbon atoms and at least one atom selected from the group consisting of an oxygen atom, a sulfur atom, and a nitrogen atom. --

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*